United States Patent
Tabor

(10) Patent No.: US 6,792,373 B2
(45) Date of Patent: Sep. 14, 2004

(54) METHODS AND APPARATUS FOR SEMICONDUCTOR TESTING

(75) Inventor: Eric Paul Tabor, Gilbert, AZ (US)

(73) Assignee: Test Advantage, Inc., Tempe, AZ (US)

( * ) Notice: Subject to any disclaimer, the term of this patent is extended or adjusted under 35 U.S.C. 154(b) by 12 days.

(21) Appl. No.: 10/154,627

(22) Filed: May 24, 2002

(65) Prior Publication Data

US 2003/0014205 A1 Jan. 16, 2003

Related U.S. Application Data

(63) Continuation-in-part of application No. 09/872,195, filed on May 31, 2001, now abandoned.
(60) Provisional application No. 60/293,577, filed on May 24, 2001, provisional application No. 60/295,188, filed on May 31, 2001, and provisional application No. 60/374,328, filed on Apr. 21, 2002.

(51) Int. Cl.[7] .............................................. G06F 19/00
(52) U.S. Cl. ....................... 702/108; 702/117; 702/118; 702/119; 702/120
(58) Field of Search .......................... 702/84, 108, 117, 702/118, 119, 120, 121, 122, 123, 124, 125, 179, 182, 183, 187, 189, 190; 714/721, 724; 438/10, 14

(56) References Cited

U.S. PATENT DOCUMENTS

| | | | | | |
|---|---|---|---|---|---|
| 5,668,745 | A | * | 9/1997 | Day | 702/121 |
| 5,835,891 | A | * | 11/1998 | Stoneking | 702/117 |
| 6,184,048 | B1 | * | 2/2001 | Ramon | 438/14 |
| 6,366,851 | B1 | * | 4/2002 | Chojnacki et al. | 701/208 |

OTHER PUBLICATIONS

Clauia Becker, Performance Criteria for Multivariate outlier Identification procedures, 2000, University of Dortmund, Department of Statistics, Germany, 1page.*

* cited by examiner

*Primary Examiner*—Bryan Bui
(74) *Attorney, Agent, or Firm*—Noblitt & Gilmore, LLC.

(57) ABSTRACT

A method and apparatus for testing semiconductors according to various aspects of the present invention comprises a test system comprising an outlier identification element configured to identify significant data in a set of test results. The test system may be configured to provide the data in an output report. The outlier identification element suitably performs the analysis at run time. The outlier identification element may also operate in conjunction with a smoothing system to smooth the data and identify trends and departures from test result norms.

20 Claims, 15 Drawing Sheets

METHODS AND APPARATUS FOR SEMICONDUCTOR TESTING

CROSS-REFERENCES TO RELATED APPLICATIONS

This application is a continuation-in-part of U.S. patent application Ser. No. 09/872,195, filed on May 31, 2001, now abandoned, entitled METHODS AND APPARATUS FOR DATA SMOOTHING, and claims the benefit of U.S. Provisional Patent Application No. 60/293,577, filed May 24, 2001, entitled METHODS AND APPARATUS FOR DATA SMOOTHING; U.S. Provisional Patent Application No. 60/295,188, filed May 31, 2001, entitled METHODS AND APPARATUS FOR TEST DATA CONTROL AND ANALYSIS; and U.S. Provisional Patent Application No. 60/374,328, filed Apr. 21, 2002, entitled METHODS AND APPARATUS FOR TEST PROGRAM ANALYSIS AND ENHANCEMENT; and incorporates the disclosure of each application by reference. To the extent that the present disclosure conflicts with any referenced application, however, the present disclosure is to be given priority.

FIELD OF THE INVENTION

The invention relates to semiconductor testing.

BACKGROUND OF THE INVENTION

Semiconductor companies test components to ensure that the components operate properly. The test data not only determine whether the components function properly, but also may indicate deficiencies in the manufacturing process. Accordingly, many semiconductor companies may analyze the collected data from several different components to identify problems and correct them. For example, the company may gather test data for multiple chips on each wafer among several different lots. This data may be analyzed to identify common deficiencies or patterns of defects or identify parts that may exhibit quality and performance issues and to identify or classify user-defined "good parts". Steps may then be taken to correct the problems. Testing is typically performed before device packaging (at wafer level) as well as upon completion of assembly (final test).

Gathering and analyzing test data is expensive and time consuming. Automatic testers apply signals to the components and read the corresponding output signals. The output signals may be analyzed to determine whether the component is operating properly. Each tester generates a large volume of data. For example, each tester may perform 200 tests on a single component, and each of those tests may be repeated 10 times. Consequently, a test of a single component may yield 2000 results. Because each tester is testing 100 or more components an hour and several testers may be connected to the same server, an enormous amount of data must be stored. Further, to process the data, the server typically stores the test data in a database to facilitate the manipulation and analysis of the data. Storage in a conventional database, however, requires further storage capacity as well as time to organize and store the data.

The analysis of the gathered data is also difficult. The volume of the data may demand significant processing power and time. As a result, the data is not usually analyzed at product run time, but is instead typically analyzed between test runs or in other batches.

To alleviate some of these burdens, some companies only sample the data from the testers and discard the rest. Analyzing less than all of the data, however, ensures that the resulting analysis cannot be fully complete and accurate. As a result, sampling degrades the complete understanding of the test results.

In addition, acquiring the test data presents a complex and painstaking process. A test engineer prepares a test program to instruct the tester to generate the input signals to the component and receive the output signals. The program tends to be very complex to ensure full and proper operation of the component. Consequently, the test program for a moderately complex integrated circuit involves a large number of tests and results. Preparing the program demands extensive design and modification to arrive at a satisfactory solution, and optimization of the program, for example to remove redundant tests or otherwise minimize test time, requires additional exertion.

SUMMARY OF THE INVENTION

A method and apparatus for testing semiconductors according to various aspects of the present invention comprises a test system comprising an outlier identification element configured to identify significant data in a set of test results. The test system may be configured to provide the data in an output report. The outlier identification element suitably performs the analysis at run time. The outlier identification element may also operate in conjunction with a smoothing system to smooth the data and identify trends and departures from test result norms.

BRIEF DESCRIPTION OF THE DRAWING

A more complete understanding of the present invention may be derived by referring to the detailed description and the claims when considered in connection with the following illustrative figures, which may not be to scale. Like reference numbers refer to similar elements throughout the figures.

Elements in the figures are illustrated for simplicity and clarity and have not necessarily been drawn to scale. For example, the connections and steps performed by some of the elements in the figures may be exaggerated or omitted relative to other elements to help to improve understanding of embodiments of the present invention.

DETAILED DESCRIPTION OF AN EXEMPLARY EMBODIMENT

The present invention may be described in terms of functional block components and various process steps. Such functional blocks and steps may be realized by any number of hardware or software components configured to perform the specified functions. For example, the present invention may employ various testers, processors, storage systems, processes, and integrated circuit components, e.g., statistical engines, memory elements, signal processing elements, logic elements, programs, and the like, which may carry out a variety of functions under the control of one or more testers, microprocessors, or other control devices. In addition, the present invention may be practiced in conjunction with any number of test environments, and each system described is merely one exemplary application for the invention. Further, the present invention may employ any number of conventional techniques for data analysis, component interfacing, data processing, component handling, and the like.

Figure 1:
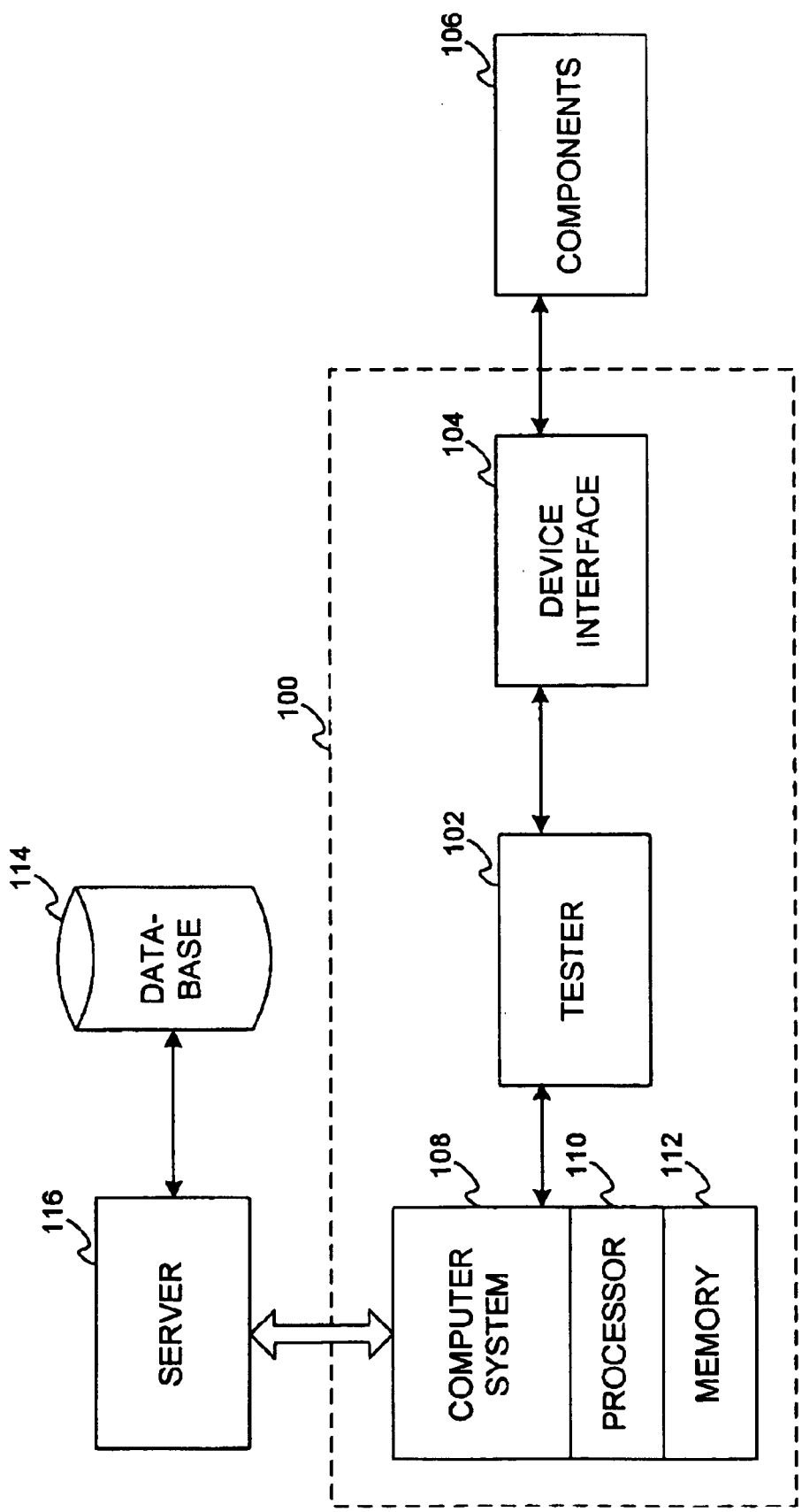
FIG. 1 is a block diagram of a test system according to various aspects of the present invention and associated functional components.

Referring to FIG. 1, a method and apparatus according to various aspects of the present invention operate in conjunction with a test system 100 having a tester 102, such as automatic test equipment (ATE) for testing semiconductors. In the present embodiment, the test system 100 comprises a tester 102 and a computer system 108. The test system 100 may be configured for testing any components 106, such as semiconductor devices on a wafer, circuit boards, packaged devices, or other electrical or optical systems. In the present embodiment, the components 106 comprise multiple integrated circuit dies formed on a wafer or packaged integrated circuits or devices.

The tester 102 suitably comprises any test equipment that tests components 106 and generates output data relating to the testing. The tester 102 may comprise a conventional automatic tester, such as a Teradyne tester, and suitably operates in conjunction with other equipment for facilitating the testing. The tester 102 may be selected and configured according to the particular components 106 to be tested and/or any other appropriate criteria.

The tester 102 may operate in conjunction with the computer system 108 to, for example, program the tester 102, load and/or execute the test program, collect data, provide instructions to the tester 102, implement a statistical engine, control tester parameters, and the like. In the present embodiment, the computer system 108 receives tester data from the tester 102 and performs various data analysis functions independently of the tester 102. The computer system 108 also implements a statistical engine to analyze data from the tester 102. The computer system 108 may comprise a separate computer, such as a personal computer or workstation, connected to or networked with the tester 102 to exchange signals with the tester 102. In an alternative embodiment, the computer system 108 may be omitted from or integrated into other components of the test system 100 and various functions may be performed by other components, such as the tester 102.

The computer system 108 includes a processor 110 and a memory 112. The processor 110 comprises any suitable processor, such as a conventional Intel, Motorola, or Advanced Micro Devices processor, operating in conjunction with any suitable operating system, such as Windows 98, Windows NT, Unix, or Linux. Similarly, the memory 112 may comprise any appropriate memory accessible to the processor 110, such as a random access memory (RAM) or other suitable storage system, for storing data. In particular, the memory 112 of the present system includes a fast access memory for storing and receiving information and is suitably configured with sufficient capacity to facilitate the operation of the computer 108.

In the present embodiment, the memory 112 includes capacity for storing output results received from the tester 102 and facilitating analysis of the output test data. The memory 112 is configured for fast storage and retrieval of test data for analysis. The memory 112 is suitably configured to store the elements of a dynamic datalog, suitably comprising a set of information selected by the test system 100 and/or the operator according to selected criteria and analysis based on the test results.

For example, the memory 112 suitably stores a component identifier for each component 106, such as x-y coordinates corresponding to a position of the component 106 on a wafer map for the tested wafer. Each x-y coordinate in the memory 112 may be associated with a particular component 106 at the corresponding x-y coordinate on the wafer map. Each component identifier has one or more fields, and each field corresponds, for example, to a particular test performed on the component 106 at the corresponding x-y position on the wafer, a statistic related to the corresponding component 106, or other relevant data. The memory 112 may be configured to include any data identified by the user as desired according to any criteria or rules.

The computer 108 of the present embodiment also suitably has access to a storage system, such as another memory (or a portion of the memory 112), a hard drive array, an optical storage system, or other suitable storage system. The storage system may be local, like a hard drive dedicated to the computer 108 or the tester 102, or may be remote, such as a hard drive array associated with a server to which the test system 100 is connected. The storage system may store programs and/or data used by the computer 108 or other components of the test system 100. In the present embodiment, the storage system comprises a database 114 available via a remote server 116 comprising, for example, a main production server for a manufacturing facility. The database 114 stores tester information, such as tester data files, master data files for operating the test system 100 and its components, test programs, downloadable instructions for the test system 100, and the like.

The test system 100 may include additional equipment to facilitate testing of the components 106. For example, the present test system 100 includes a device interface 104, like a conventional device interface board and/or a device handler or prober, to handle the components 106 and provide an interface between the components 106 and the tester 102. The test system 100 may include or be connected to other components, equipment, software, and the like to facilitate testing of the components 106 according to the particular configuration, application, environment of the test system 100, or other relevant factors. For example, in the present embodiment, the test system 100 is connected to an appropriate communication medium, such as a local area network, intranet, or global network like the internet, to transmit information to other systems, such as the remote server 116.

The test system 100 may include one or more testers 102 and one or more computers 108. For example, one computer 108 may be connected to an appropriate number of, such as up to twenty or more, testers 102 according to various factors, such as the system's throughput and the configuration of the computer 108. Further, the computer 108 may be separate from the tester 102, or may be integrated into the tester 102, for example utilizing one or more processors, memories, clock circuits, and the like of the tester 102 itself. In addition, various functions may be performed by different computers. For example, a first computer may perform various pre-analysis tasks, several computers may then receive the data and perform data analysis, and another set of computers may prepare the dynamic datalogs and/or other output reports.

A test system 100 according to various aspects of the present invention tests the components 106 and provides enhanced analysis and test results. For example, the supplemental analysis may identify incorrect, questionable, or unusual results, repetitive tests, and/or tests with a relatively high probability of failure. The operator, such as the product engineer, test engineer, manufacturing engineer, device engineer, or other personnel using the test data, may then use the results to verify and/or improve the test system 100 and classify components 106.

Figure 2:
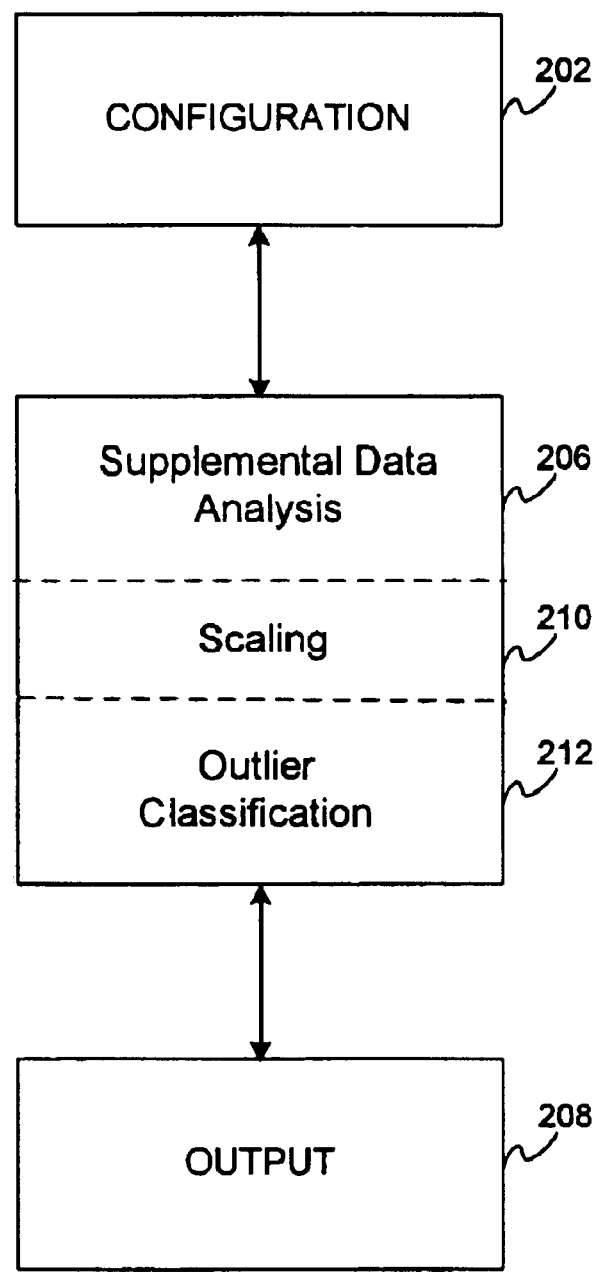
FIG. 2 is a block diagram of elements for operating the test system.

The test system 100 according to various aspects of the present invention executes an enhanced test process for testing the components 106 and collecting and analyzing test data. The test system 100 suitably operates in conjunction with a software application executed by the computer 108. Referring to FIG. 2, the software application of the present embodiment includes multiple elements for implementing the enhanced test process, including a configuration element 202, a supplementary data analysis element 206, and an output element 208. Each element 202, 206, 208 suitably comprises a software module operating on the computer 108 to perform various tasks. Generally, the configuration element 202 prepares the test system 100 for testing and analysis. In the supplementary data analysis element 206, output test data from the tester 102 is analyzed to generate supplementary test data, suitably at run time and automatically. The supplementary test data is then transmitted to the operator or another system by the output element 208.

The configuration element 202 configures the test system 100 for testing the components 106 and analyzing the test data. The test system 100 suitably uses a predetermined set of initial parameters and, if desired, information from the operator to configure the test system 100. The test system 100 is suitably initially configured with predetermined or default parameters to minimize operator attendance to the test system 100. Adjustments may be made to the configuration by the operator, if desired, for example via the computer 108.

Figure 3:
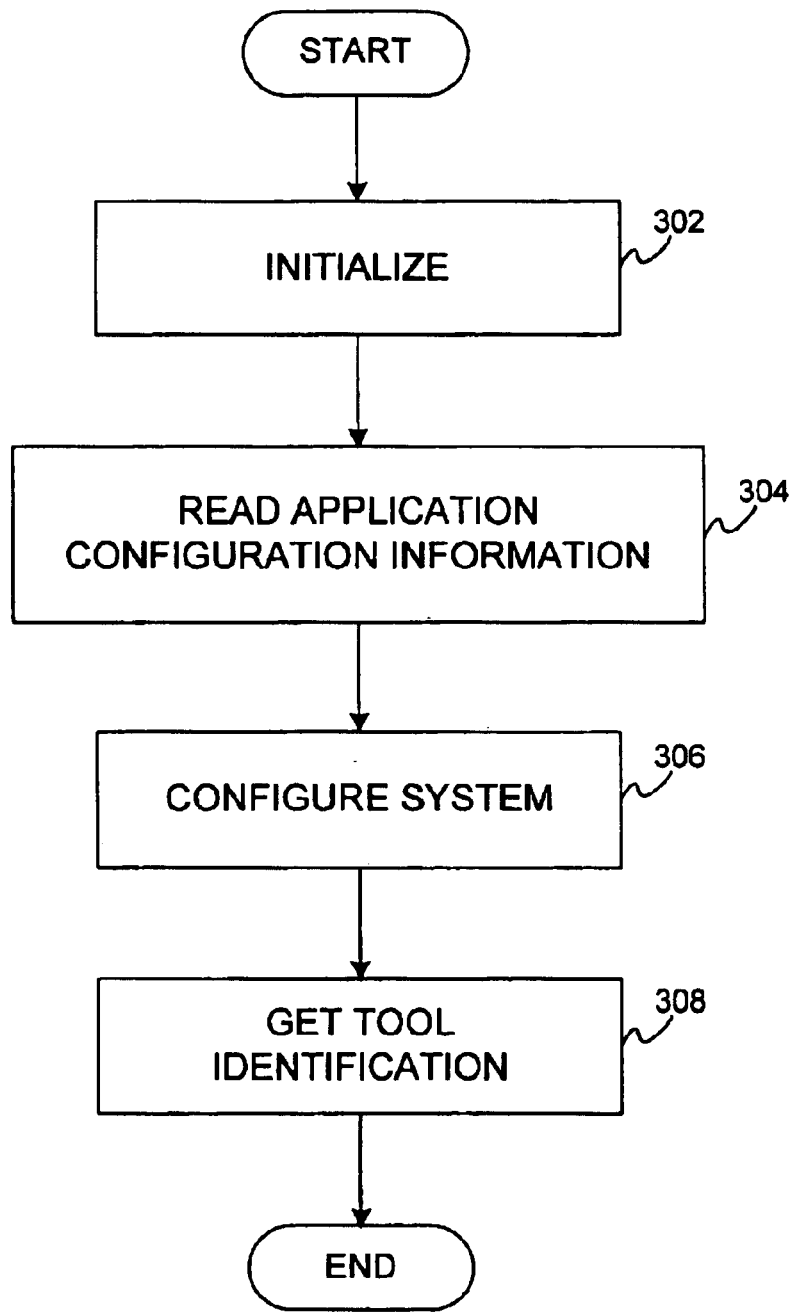
FIG. 3 illustrates a flow chart for a configuration element.

Referring to FIG. 3, an exemplary configuration process 300 performed by the configuration element 202 begins with an initialization procedure (step 302) to set the computer 108 in an initial state. The configuration element 202 then obtains application configuration information (step 304), for example from the database 114, for the computer 108 and the tester 102. For example, the configuration element 202 may access a master configuration file for the enhanced test process and/or a tool configuration file relating to the tester 102. The master configuration file may contain data relating to the proper configuration for the computer 108 and other components of the test system 100 to execute the enhanced test process. Similarly, the tool configuration file suitably includes data relating to the tester 102 configuration, such as connection, directory, IP address, tester node identification, manufacturer, flags, prober identification, or any other pertinent information for the tester 102.

The configuration element 202 may then configure the test system 100 according to the data contained in the master configuration file and/or the tool configuration file (step 306). In addition, the configuration element 202 may use the configuration data to retrieve further relevant information from the database 114, such as the tester's 102 identifier (step 308) for associating data like logistics instances for tester data with the tester 102. The test system 100 information also suitably includes one or more default parameters that may be accepted, declined, or adjusted by the operator. For example, the test system 100 information may include global statistical process control (SPC) rules and goals that are submitted to the operator upon installation, configuration, power-up, or other appropriate time for approval and/or modification. The test system 100 information may also include default wafer maps or other files that are suitably configured for each product, wafer, component 106, or other item that may affect or be affected by the test system 100. The configuration algorithms, parameters, and any other criteria may be stored in a recipe file for easy access, correlation to specific products and/or tests, and for traceability.

When the initial configuration process is complete, the test system 100 commences a test run, for example in conjunction with a conventional series of tests, in accordance with a test program. The tester 102 suitably executes the test program to apply signals to connections on the components 106 and read output test data from the components 106. The tester 102 may perform multiple tests on each component 106 on a wafer, and each test may be repeated several times on the same component 106. Test data from the tester 102 is stored for quick access and supplemental analysis as the test data is acquired. The data may also be stored in a long-term memory for subsequent analysis and use.

Figure 9:
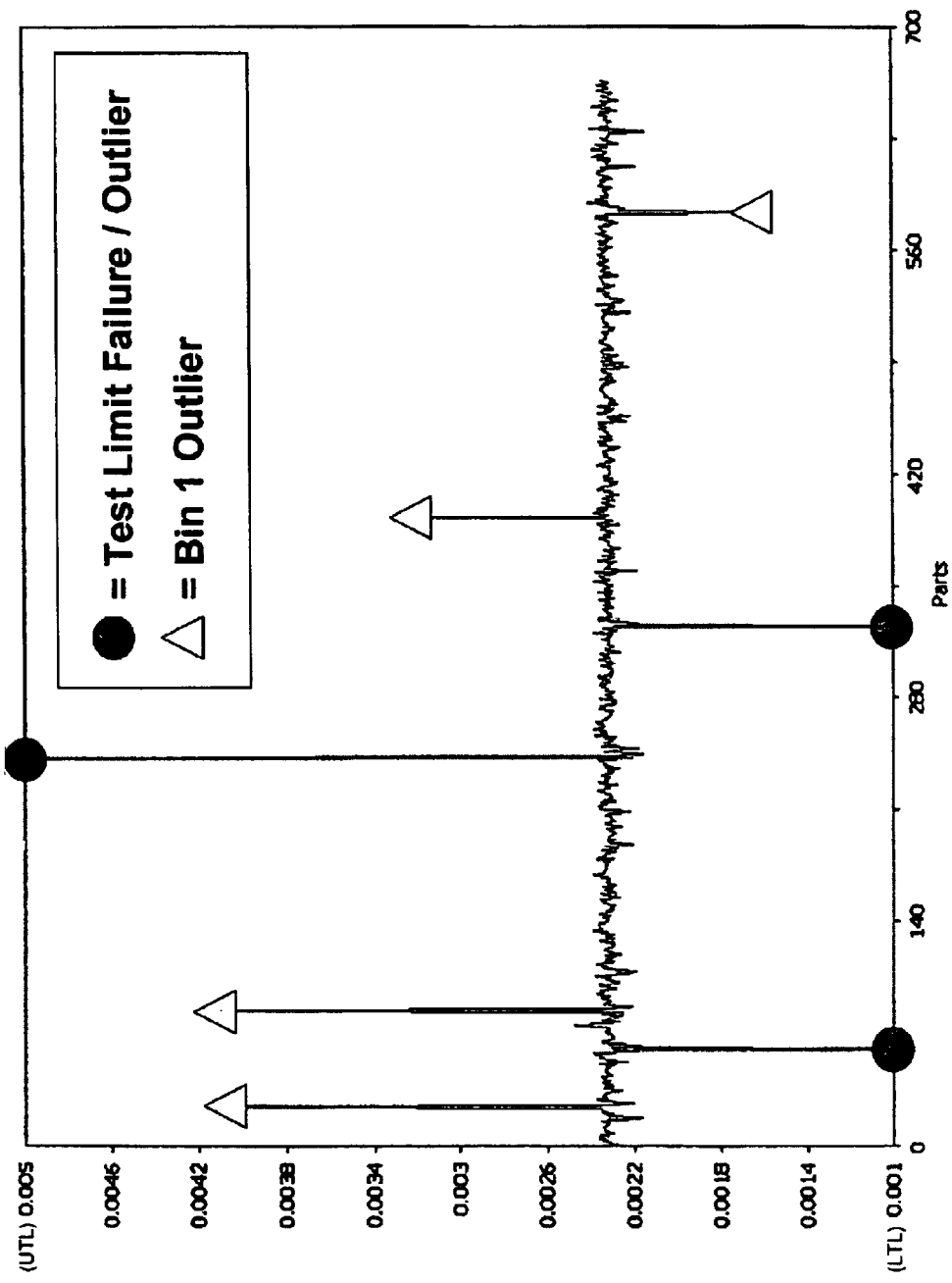
FIG. 9 is a plot of test data for a test of multiple components.

Each test generates at least one result for at least one of the components. Referring to FIG. 9, an exemplary set of test results for a single test of multiple components comprises a first set of test results having statistically similar values and a second set of test results characterized by values that stray from the first set. Each test result may be compared to an upper test limit and a lower test limit. If a particular result for a component exceeds either limit, the component may be classified as a "bad part".

Some of the test results in the second set that stray from the first set may exceed the control limits, while others do not. For the present purposes, those test results that stray from the first set but do not exceed the control limits or otherwise fail to be detected are referred to as "outliers". The outliers in the test results may be identified and analyzed for any appropriate purpose, such as to identify potentially unreliable components. The outliers may also be used to identify various potential problems and/or improvements in the test and manufacturing processes.

As the tester 102 generates the test results, the output test data for each component, test, and repetition is stored by the tester 102 in a tester data file. The output test data received from each component 106 is analyzed by the tester 102 to classify the performance of the component 106, for example by comparison to the upper and lower test limits, and the results of the classification are also stored in the tester data file. The tester data file may include additional information as well, such as logistics data and test program identification data. The tester data file is then provided to the computer 108 in an output file, such as a standard tester data format (STDF) file, and stored in memory.

When the computer 108 receives the tester data file, the supplementary data analysis element 206 analyzes the data to provide enhanced output results. The supplementary data analysis element 206 may provide any appropriate analysis of the tester data to achieve any suitable objective. For example, the supplementary data analysis element 206 may implement a statistical engine for analyzing the output test data at run time and identifying data and characteristics of the data of interest to the operator. The data and characteristics identified may be stored, while data that is not identified may be otherwise disposed of, such as discarded.

The supplementary data analysis element 206 may, for example, calculate statistical figures according to the data and a set of statistical configuration data. The statistical configuration data may call for any suitable type of analysis according to the needs of the test system 100 and/or the operator, such as statistical process control, outlier identification and classification, signature analysis, and data correlation. Further, the supplementary data analysis element 206 suitably performs the analysis at run time, i.e., within a matter of seconds or minutes following generation of the test data. The supplementary data analysis element 206 may also perform the analysis automatically with minimal intervention from the operator and/or test engineer.

Figure 4A:
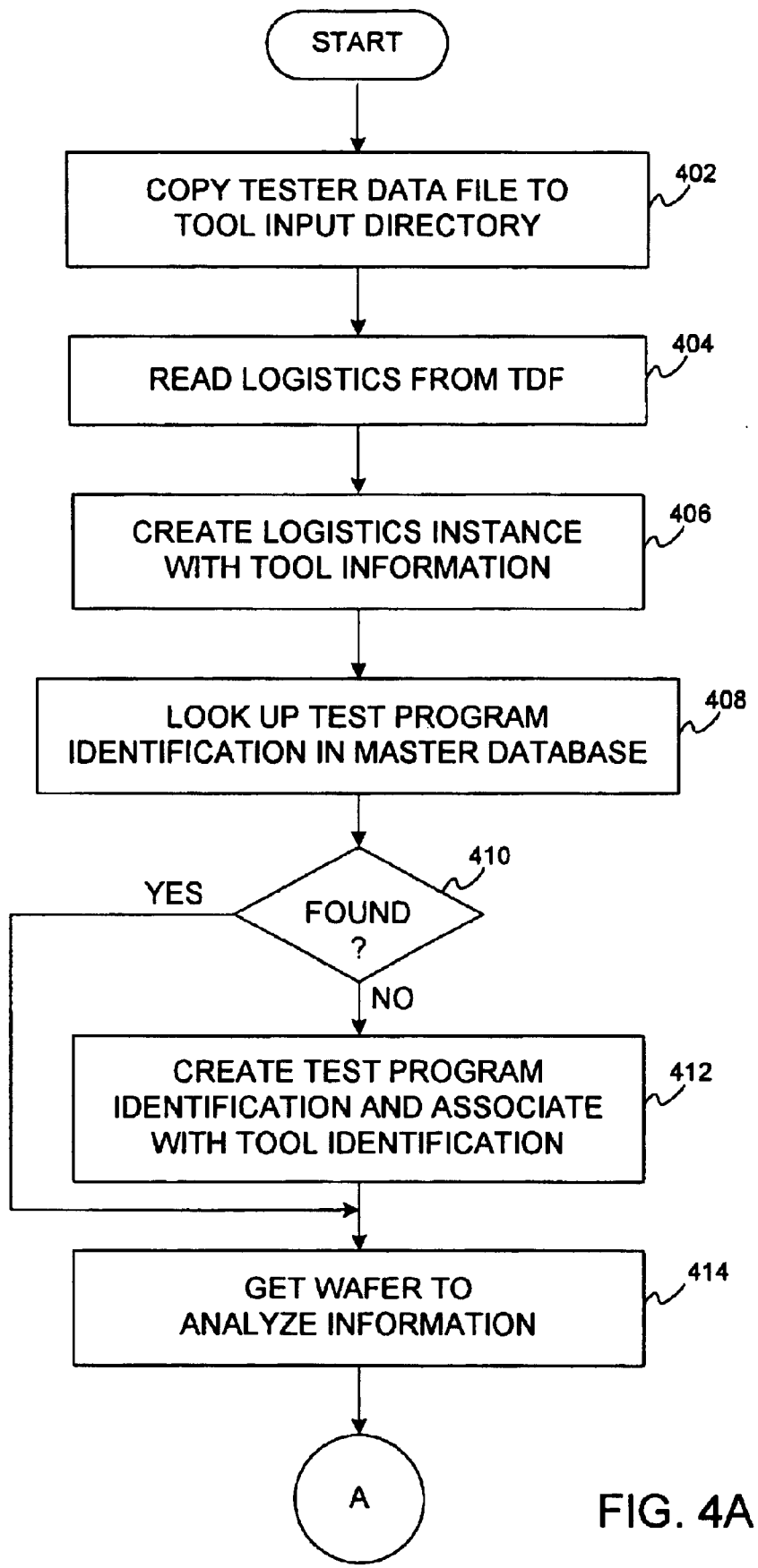
FIGS. 4A–C illustrate a flow chart for a supplemental data analysis element.
Figure 4B:
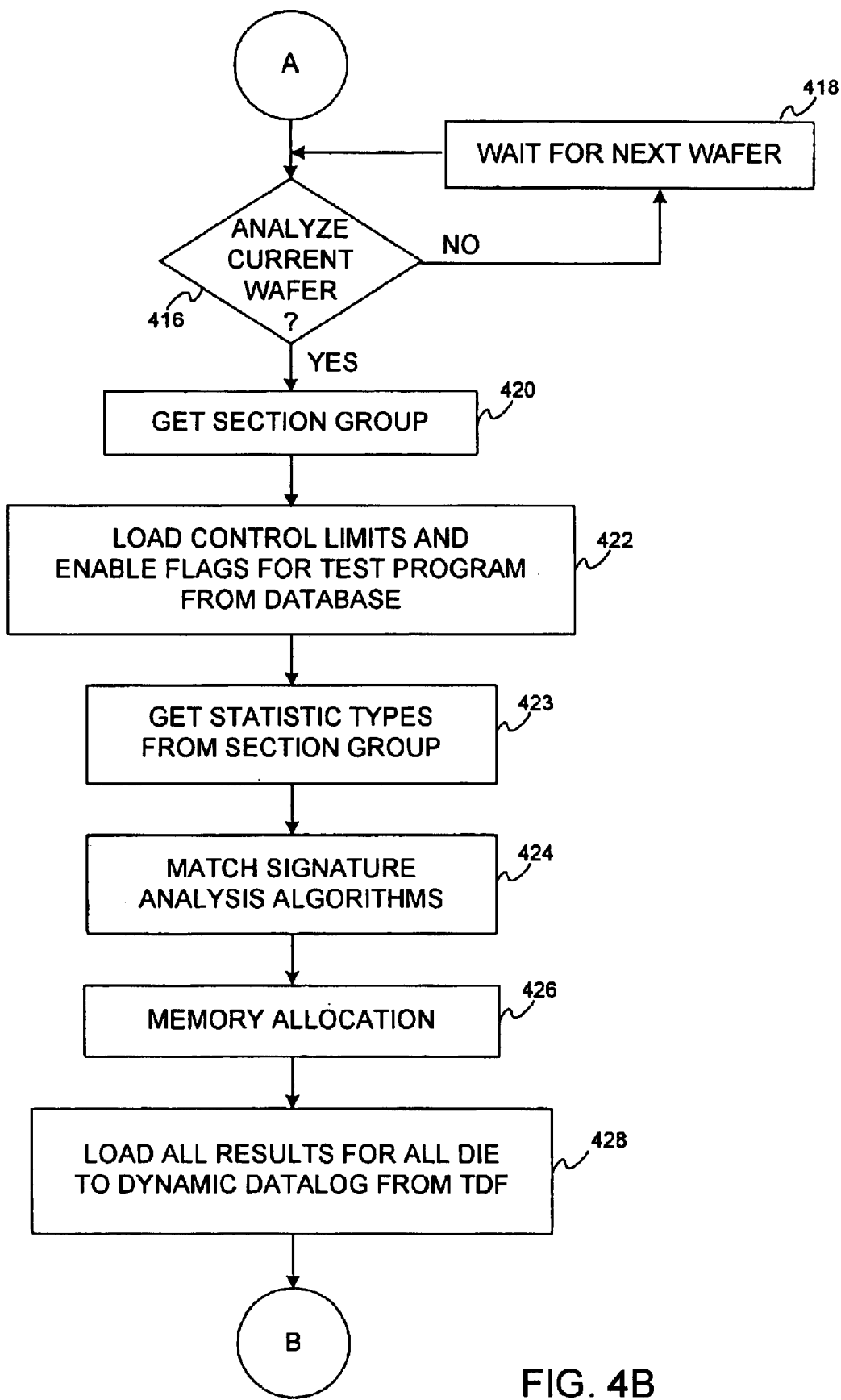
Figure 4C:
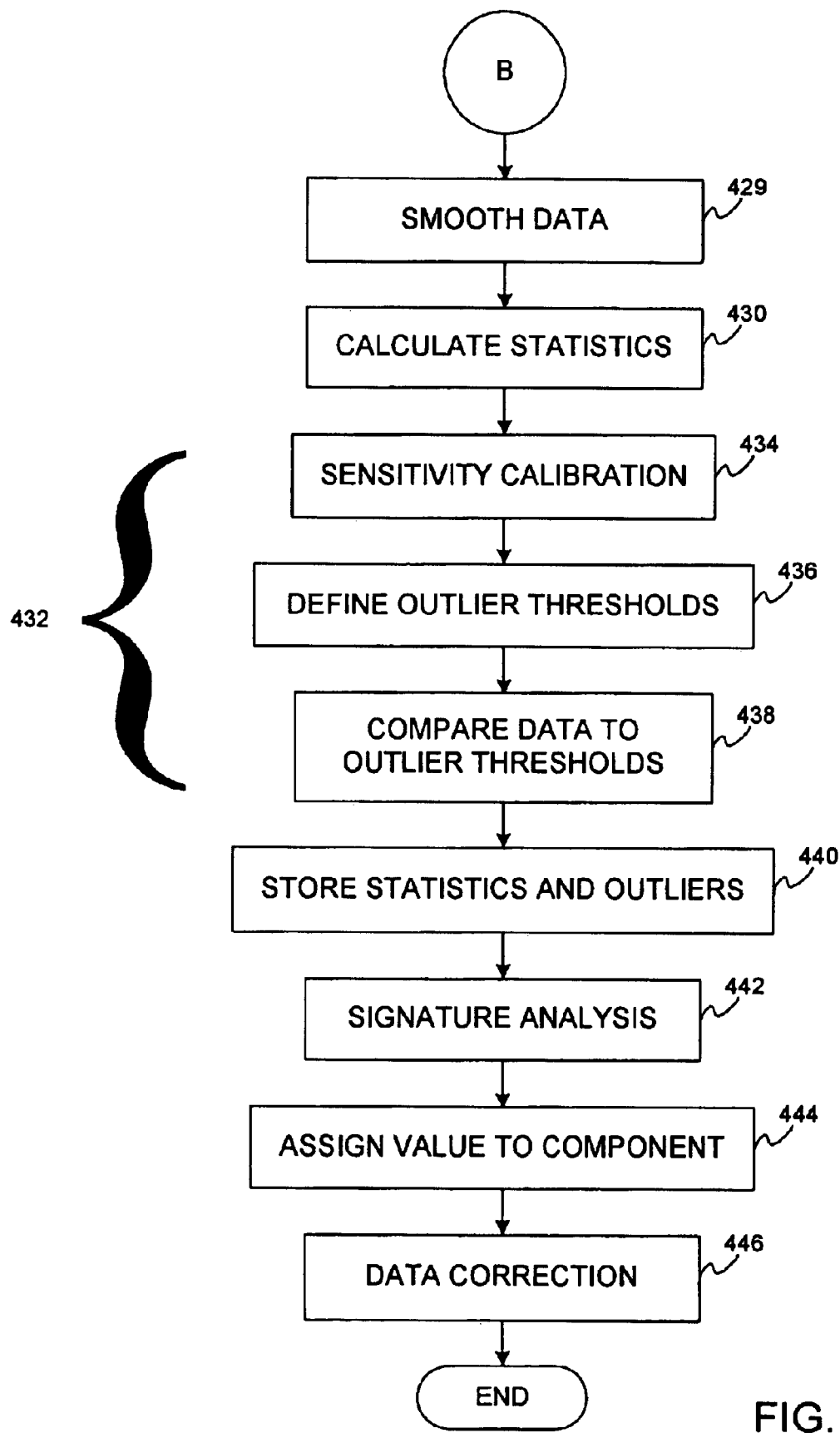

In the present test system 100, after the computer 108 receives and stores the tester data file, the supplementary data analysis element 206 performs various preliminary tasks to prepare the computer 108 for analysis of the output test data and facilitate generation of supplementary data and preparation of an output report. Referring now to FIGS. 4A–C, in the present embodiment, the supplementary data analysis element 206 initially copies the tester data file to a tool input directory corresponding to the relevant tester 102 (step 402). The supplementary data analysis element 206 also retrieves configuration data to prepare the computer 108 for supplementary analysis of the output test data.

The configuration data suitably includes a set of logistics data that may be retrieved from the tester data file (step 404). The supplementary data analysis element 206 also creates a logistics reference (step 406). The logistics reference may include tester 102 information, such as the tester 102 information derived from the tool configuration file. In addition, the logistics reference is assigned an identification.

The configuration data may also include an identifier for the test program that generated the output test data. The test program may be identified in any suitable manner, such as looking it up in the database 114 (step 408), by association with the tester 102 identification, or reading it from the master configuration file. If no test program identification can be established (step 410), a test program identification may be created and associated with the tester identification (step 412).

The configuration data further identifies the wafers in the test run to be processed by the supplementary data analysis element 206, if fewer than all of the wafers. In the present embodiment, the supplementary data analysis element 206 accesses a file indicating which wafers are to be analyzed (step 414). If no indication is provided, the computer 108 suitably defaults to analyzing all of the wafers in the test run.

If the wafer for the current test data file is to be analyzed (step 416), the supplementary data analysis element 206 proceeds with performing the supplementary data analysis on the test data file for the wafer. Otherwise, the supplementary data analysis element 206 waits for or accesses the next test data file (step 418).

The supplementary data analysis element 206 may establish one or more section groups to be analyzed for the various wafers to be tested (step 420). To identify the appropriate section group to apply to the output test data, the supplementary data analysis element 206 suitably identifies an appropriate section group definition, for example according to the test program and/or the tester identification. Each section group includes one or more section arrays, and each section array includes one or more sections of the same section types.

Figure 5:
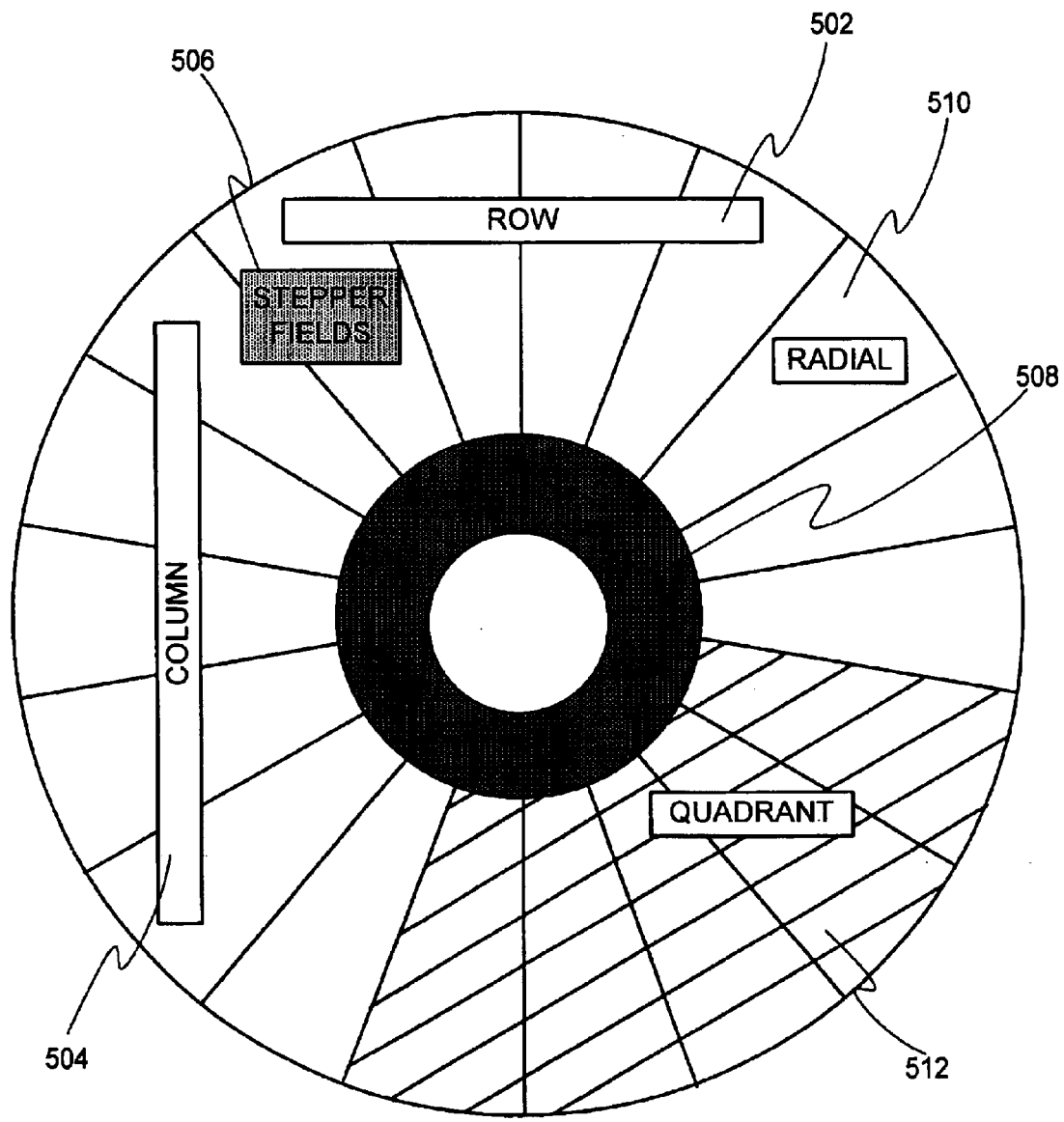
FIG. 5 is a diagram of various sections of a wafer.

Section types comprise various sorts of component 106 groups positioned in predetermined areas of the wafer. For example, referring to FIG. 5, a section type may include a row 502, a column 504, a stepper field 506, a circular band 508, a radial zone 510, a quadrant 512, or any other desired grouping of components. Different section types may be used according to the configuration of the components, such as order of components processed, sections of a tube, or the like. Such groups of components 106 are analyzed together to identify, for example, common defects or characteristics that may be associated with the group. For example, if a particular portion of the wafer does not conduct heat like other portions of the wafer, the test data for a particular group of components 106 may reflect common characteristics or defects associated with the uneven heating of the wafer.

Upon identifying the section group for the current tester data file, the supplemental data analysis element 206 retrieves any further relevant configuration data, such as control limits and enable flags for the test program and/or tester 102 (step 422). In particular, the supplemental data analysis element 206 suitably retrieves a set of desired statistics or calculations associated with each section array in the section group (step 423). Desired statistics and calculations may be designated in any manner, such as by the operator or retrieved from a file. Further, the supplemental data analysis element 206 may also identify one or more signature analysis algorithms (step 424) for each relevant section type or other appropriate variation relating to the wafer and retrieve the signature algorithms from the database 114 as well.

All of the configuration data may be provided by default or automatically accessed by the configuration element 202 or the supplemental data analysis element 206. Further, the configuration element 202 and the supplemental data analysis element 206 of the present embodiment suitably allow the operator to change the configuration data according to the operator's wishes or the test system 100 requirements. When the configuration data have been selected, the configuration data may be associated with relevant criteria and stored for future use as default configuration data. For example, if the operator selects a certain section group for a particular kind of components 106, the computer 108 may automatically use the same section group for all such components 106 unless instructed otherwise by the operator.

The supplemental data analysis element 206 also provides for configuration and storage of the tester data file and additional data. The supplemental data analysis element 206 suitably allocates memory (step 426), such as a portion of the memory 112, for the data to be stored. The allocation suitably provides memory for all of the data to be stored by the supplemental data analysis element 206, including output test data from the tester data file, statistical data generated by the supplemental data analysis element 206, control parameters, and the like. The amount of memory allocated may be calculated according to, for example, the number of tests performed on the components 106, the number of section group arrays, the control limits, statistical calculations to be performed by the supplementary data analysis element 206, and the like.

When all of the configuration data for performing the supplementary analysis are ready and upon receipt of the output test data, the supplementary data analysis element 206 loads the relevant test data into memory (step 428) and performs the supplementary analysis on the output test data. The supplementary data analysis element 206 may perform any number and types of data analyses according to the components 106, configuration of the test system 100, desires of the operator, or other relevant criteria. The supplemental data analysis element 206 may be configured to analyze the sections for selected characteristics identifying potentially defective components 106 and patterns, trends, or other characteristics in the output test data that may indicate manufacturing concerns or flaws.

The present supplementary data analysis element 206, for example, smoothes the output test data, calculates and analyzes various statistics based on the output test data, and identifies data and/or components 106 corresponding to various criteria. The present supplementary data analysis element 206 may also classify and correlate the output test data to provide information to the operator and/or test engineer relating to the components 106 and the test system 100. For example, the present supplementary data analysis element 206 may perform output data correlations, for example to identify potentially related or redundant tests, and outlier incidence analyses to identify tests having frequent outliers.

The supplementary data analysis element 206 may include a smoothing system to initially process the tester data to smooth the data and assist in the identification of outliers (step 429). The smoothing system may also identify significant changes in the data, trends, and the like, which may be provided to the operator by the output element 208.

The smoothing system is suitably implemented, for example, as a program operating on the computer system 108. The smoothing system suitably comprises multiple phases for smoothing the data according to various criteria. The first phase may include a basic smoothing process. The supplemental phases conditionally provide for enhanced tracking and/or additional smoothing of the test data.

The smoothing system suitably operates by initially adjusting an initial value of a selected tester datum according to a first smoothing technique, and supplementarily adjusting the value according to a second smoothing technique if at least one of the initial value and the initially adjusted value meets a threshold. The first smoothing technique tends to smooth the data. The second smoothing technique also tends to smooth the data and/or improve tracking of the data, but in a different manner from the first smoothing technique. Further, the threshold may comprise any suitable criteria for determining whether to apply supplemental smoothing. The smoothing system suitably compares a plurality of preceding adjusted data to a plurality of preceding raw data to generate a comparison result, and applies a second smoothing technique to the selected datum to adjust the value of the selected datum according to whether the comparison result meets a first threshold. Further, the smoothing system suitably calculates a predicted value of the selected datum, and may apply a third smoothing technique to the selected datum to adjust the value of the selected datum according to whether the predicted value meets a second threshold.

Figure 8:
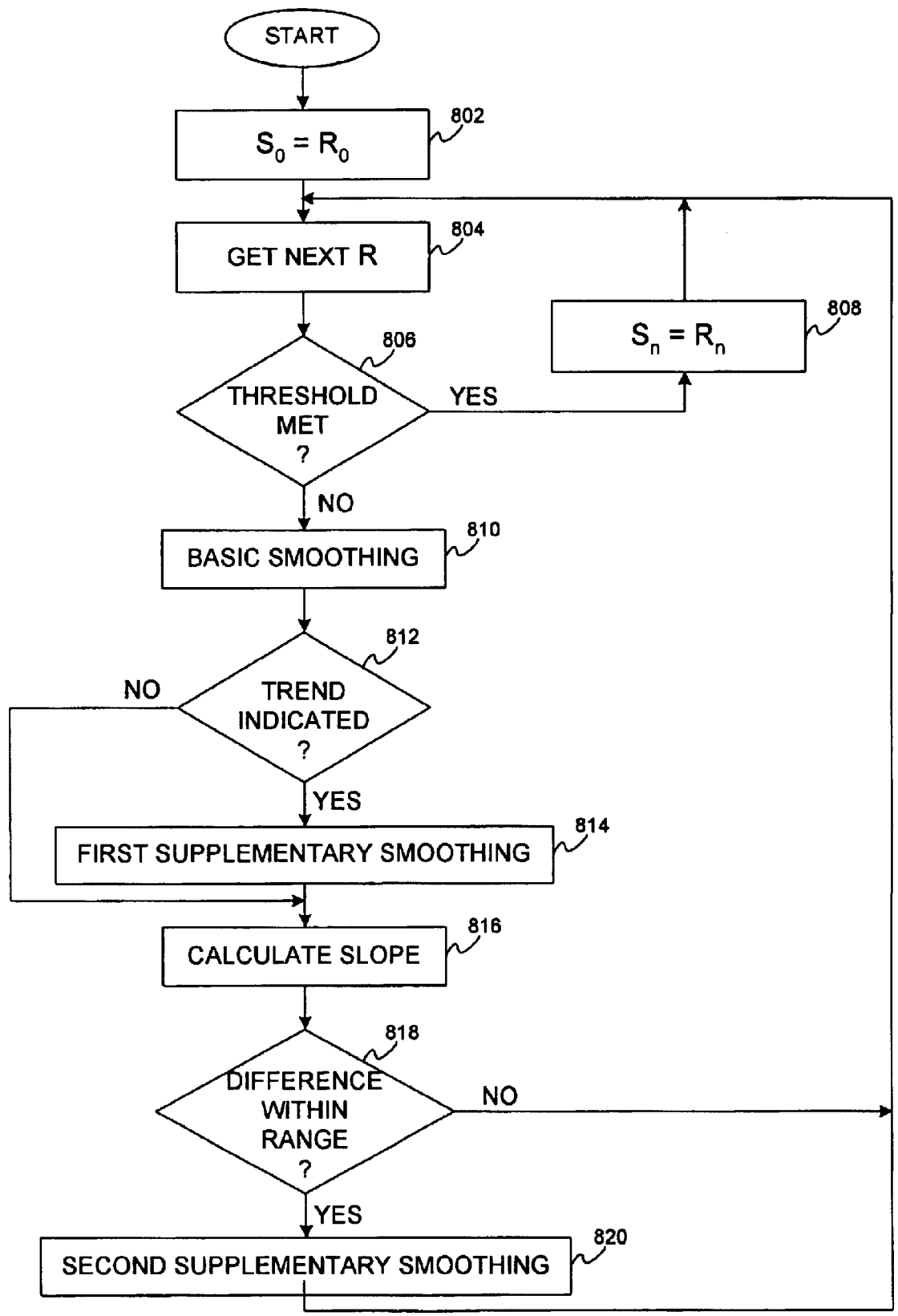
FIG. 8 is a flow chart for operation of an exemplary data smoothing system according to various aspects of the present invention.

Referring to FIG. 8, a first smoothed test data point is suitably set equal to a first raw test data point (step 802) and the smoothing system proceeds to the next raw test data point (step 804). Before performing smoothing operations, the smoothing system initially determines whether smoothing is appropriate for the data point and, if so, performs a basic smoothing operation on the data. Any criteria may be applied to determine whether smoothing is appropriate, such as according to the number of data points received, the deviation of the data point values from a selected value, or comparison of each data point value to a threshold. In the present embodiment, the smoothing system performs a threshold comparison. The threshold comparison determines whether data smoothing is appropriate. If so, the initial smoothing process is suitably configured to proceed to an initial smoothing of the data.

More particularly, in the present embodiment, the process starts with an initial raw data point $R_0$, which is also designated as the first smoothed data point $S_0$. As additional data points are received and analyzed, a difference between each raw data point ($R_n$) and a preceding smoothed data point ($S_{n-1}$) is calculated and compared to a threshold ($T_1$) (step 806). If the difference between the raw data point $R_n$ and the preceding smoothed data point $S_{n-1}$ exceeds the threshold $T_1$, it is assumed that the exceeded threshold corresponds to a significant departure from the smoothed data and indicates a shift in the data. Accordingly, the occurrence of the threshold crossing may be noted and the current smoothed data point $S_n$ is set equal to the raw data point $R_n$ (step 808). No smoothing is performed, and the process proceeds to the next raw data point.

If the difference between the raw data point and the preceding smoothed data point does not exceed the threshold $T_1$, the process calculates a current smoothed data point $S_n$ in conjunction with an initial smoothing process (step 810). The initial smoothing process provides a basic smoothing of the data. For example, in the present embodiment, the basic smoothing process comprises a conventional exponential smoothing process, such as according to the following equation:

$$S_n = (R_n - S_{n-1}) * M_1 + S_{n-1}$$

where $M_1$ is a selected smoothing coefficient, such as 0.2 or 0.3.

The initial smoothing process suitably uses a relatively low coefficient $M_1$ to provide a significant amount of smoothing for the data. The initial smoothing process and coefficients may be selected according to any criteria and configured in any manner, however, according to the application of the smoothing system, the data processed, requirements and capabilities of the smoothing system, and/or any other criteria. For example, the initial smoothing process may employ random, random walk, moving average, simple exponential, linear exponential, seasonal exponential, exponential weighted moving average, or any other appropriate type of smoothing to initially smooth the data.

The data may be further analyzed for and/or subjected to smoothing. Supplementary smoothing may be performed on the data to enhance the smoothing of the data and/or improve the tracking of the smoothed data to the raw data. Multiple phases of supplementary smoothing may also be considered and, if appropriate, applied. The various phases may be independent, interdependent, or complementary. In addition, the data may be analyzed to determine whether supplementary smoothing is appropriate.

In the present embodiment, the data is analyzed to determine whether to perform one or more additional phases of smoothing. The data is analyzed according to any appropriate criteria to determine whether supplemental smoothing may be applied (step 812). For example, the smoothing system may identify trends in the data, such as by comparing a plurality of adjusted data points and raw data points for preceding data and generating a comparison result according to whether substantially all of the preceding adjusted data share a common relationship (such as less than, greater than, or equal to) with substantially all of the corresponding raw data.

The smoothing system of the present embodiment compares a selected number $P_2$ of raw data points to an equal number of smoothed data points. If the values of all of the $P_2$ raw data points exceed (or are equal to) the corresponding smoothed data points, or if all raw data points are less than (or equal to) the corresponding smoothed data points, then the smoothing system may determine that the data is exhibiting a trend and should be tracked more closely. Accordingly, the occurrence may be noted and the smoothing applied to the data may be changed by applying supplementary smoothing. If, on the other hand, neither of these criteria is satisfied, then the current smoothed data point remains as originally calculated and the relevant supplementary data smoothing is not applied.

In the present embodiment, the criterion for comparing the smoothed data to the raw data is selected to identify a trend in the data behind which the smoothed data may be lagging. Accordingly, the number of points $P_2$ may be selected according to the desired sensitivity of the system to changing trends in the raw data.

The supplementary smoothing changes the effect of the overall smoothing according to the data analysis. Any appropriate supplementary smoothing may be applied to the data to more effectively smooth the data or track a trend in the data. For example, in the present embodiment, if the data analysis indicates a trend in the data that should be tracked more closely, then the supplementary smoothing may be applied to reduce the degree of smoothing initially applied so that the smoothed data more closely tracks the raw data (step 814).

In the present embodiment, the degree of smoothing is reduced by recalculating the value for the current smoothed data point using a reduced degree of smoothing. Any suitable smoothing system may be used to more effectively track the data or otherwise respond to the results of the data analysis. In the present embodiment, another conventional exponential smoothing process is applied to the data using a higher coefficient $M_2$:

$$S_n=(R_n-S_{n-1})*M_2+S_{n-1}$$

The coefficients $M_1$ and $M_2$ may be selected according to the desired sensitivity of the system, both in the absence ($M_1$) and the presence ($M_2$) of trends in the raw data. In various applications, for example, the value of $M_1$ may be higher than the value of $M_2$.

The supplementary data smoothing may include additional phases as well. The additional phases of data smoothing may similarly analyze the data in some manner to determine whether additional data smoothing should be applied. Any number of phases and types of data smoothing may be applied or considered according to the data analysis.

For example, in the present embodiment, the data may be analyzed and potentially smoothed for noise control, such as using a predictive process based on the slope of the smoothed data. The smoothing system computes a slope (step 816) based on a selected number $P_3$ of smoothed data points preceding the current data point according to any appropriate process, such as line regression, N-points centered, or the like. In the present embodiment, the data smoothing system uses a "least squares fit through" process to establish a slope of the preceding $P_3$ smoothed data points.

The smoothing system predicts a value of the current smoothed data point according to the calculated slope. The system then compares the difference between the previously calculated value for the current smoothed data point ($S_n$) and the predicted value for the current smoothed data point to a range number ($R_3$) (step 818). If the difference is greater than the range $R_3$, then the occurrence may be noted and the current smoothed data point is not adjusted. If the difference is within the range $R_3$, then the current smoothed data point is set equal to the difference between the calculated current smoothed data point ($S_n$) and the predicted value for the current smoothed data point ($S_{n-pred}$) multiplied by a third multiplier $M_3$ and added to the original value of the current smoothed data point (step 820). The equation:

$$S_n=(S_{n-pred}-S_n)*M_3+S_n$$

Thus, the current smoothed data point is set according to a modified difference between the original smoothed data point and the predicted smoothed data point, but reduced by a certain amount (when $M_3$ is less than 1). Applying the predictive smoothing tends to reduce point-to-point noise sensitivity during relatively flat (or otherwise nontrending) portions of the signal. The limited application of the predictive smoothing process to the smoothed data points ensures that the calculated average based on the slope does not affect the smoothed data when significant changes are occurring in the raw data, i.e., when the raw data signal is not relatively flat.

After smoothing the data, the supplementary data analysis element 206 may proceed with further analysis of the tester data. For example, the supplementary data analysis element 206 may conduct statistical process control (SPC) calculations and analyses on the output test data. More particularly, referring again to FIGS. 4A–C, the supplemental data analysis element 206 may calculate and store desired statistics for a particular component, test, and/or section (step 430). The statistics may comprise any statistics useful to the operator or the test system 100, such as SPC figures that may include averages, standard deviations, minima, maxima, sums, counts, Cp, Cpk, or any other appropriate statistics.

The supplementary data analysis element 206 also suitably performs a signature analysis to dynamically and automatically identify trends and anomalies in the data, for example according to section, based on a combination of test results for that section and/or other data, such as historical data (step 442). The signature analysis identifies signatures and applies a weighting system, suitably configured by the operator, based on any suitable data, such as the test data or identification of defects. The signature analysis may cumulatively identify trends and anomalies that may correspond to problem areas or other characteristics of the wafer or the fabrication process. Signature analysis may be conducted for any desired signatures, such as noise peaks, waveform variations, mode shifts, and noise. In the present embodiment, the computer 108 suitably performs the signature analysis on the output test data for each desired test in each desired section.

In the present embodiment, a signature analysis process may be performed in conjunction with the smoothing process. As the smoothing process analyzes the tester data, results of the analysis indicating a trend or anomaly in the data are stored as being indicative of a change in the data or an outlier that may be of significance to the operator and/or test engineer. For example, if a trend is indicated by a comparison of sets of data in the smoothing process, the occurrence of the trend may be noted and stored. Similarly, if a data point exceeds the threshold $T_1$ in the data smoothing process, the occurrence may be noted and stored for later analysis and/or inclusion in the output report.

Figure 6A:
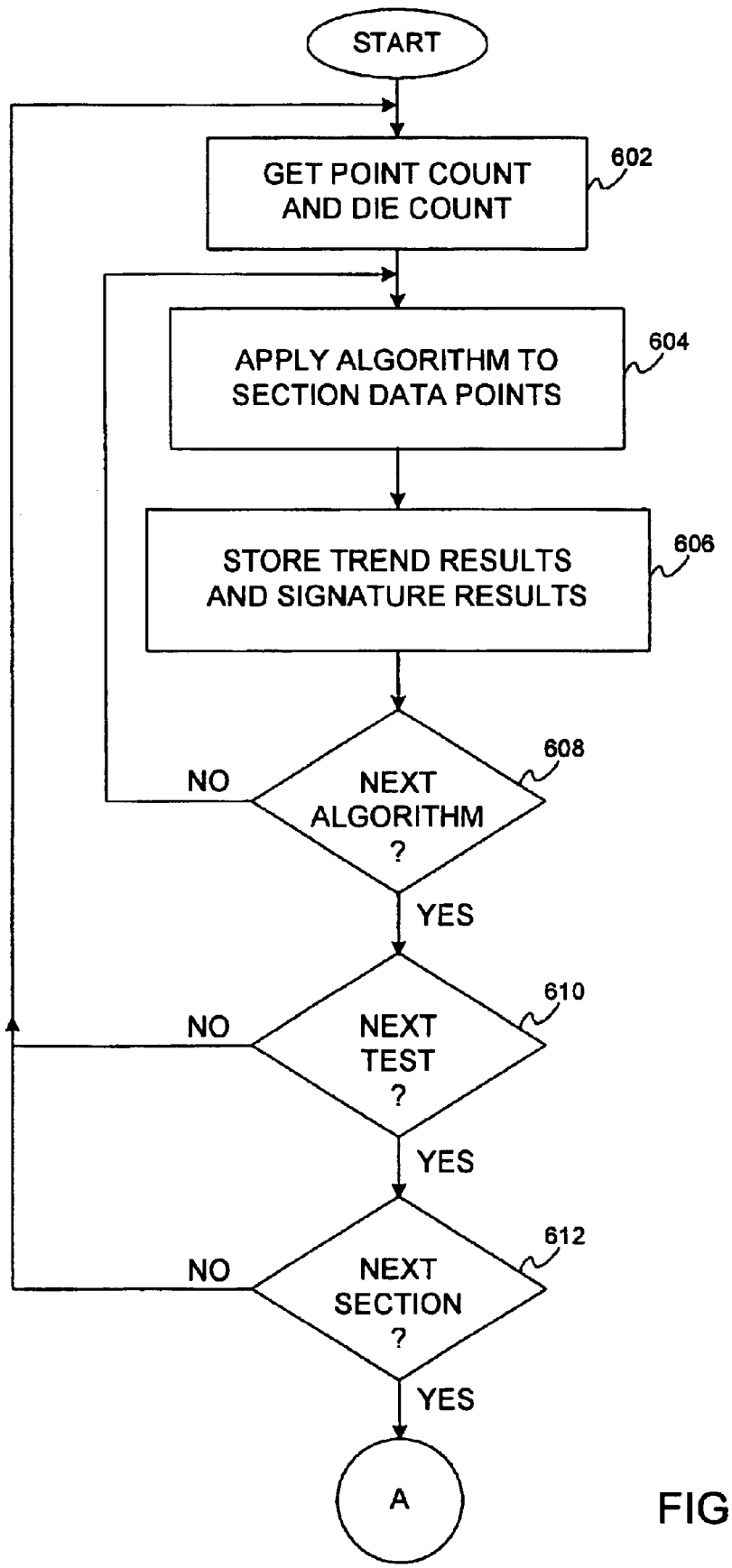
FIGS. 6A–B further illustrate a flow chart for a supplemental data analysis element.
Figure 6B:
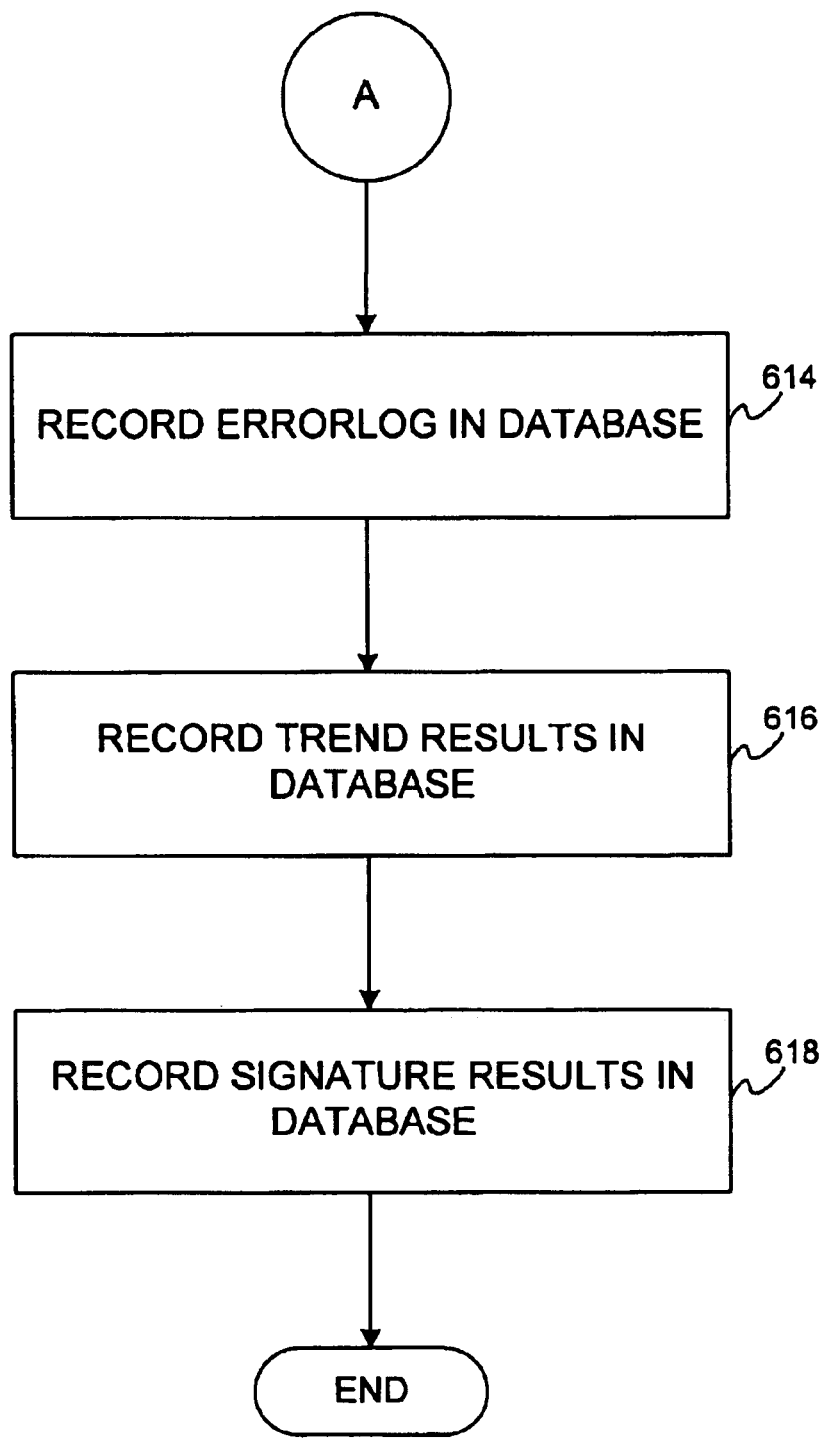

For example, referring to FIGS. 6A–B, a signature analysis process 600 may initially calculate a count (step 602) for a particular set of test data and control limits corresponding to a particular section and test. The signature analysis process 600 then applies an appropriate signature analysis algorithm to the data points (step 604). The signature analysis is performed for each desired signature algorithm, and then to each test and each section to be analyzed. Errors identified by the signature analysis, trend results, and signature results are also stored (step 606). The process is repeated for each signature algorithm (step 608), test (step 610), and section (step 612). Upon completion, the supplementary data analysis element 206 records the errors (step 614), trend results (step 616), signature results (step 618), and any other desired data in the storage system.

Upon identification of each relevant data point, such as outliers and other data of importance identified by the supplementary analysis, each relevant data point may be associated with a value identifying the relevant characteristics (step 444). For example, each relevant component or data point may be associated with a series of values, suitably expressed as a hexadecimal figure, corresponding to the results of the supplementary analysis relating to the data point. Each value may operate as a flag or other designator of a particular characteristic. For example, if a particular data point has failed a particular test completely, a first flag in the corresponding hexadecimal value may be set. If a particular data point is the beginning of a trend in the data, another flag may be set. Another value in the hexadecimal figure may include information relating to the trend, such as the duration of the trend in the data.

The supplementary data analysis element 206 may also be configured to classify and correlate the data (step 446). For example, the supplementary data analysis element 206 may utilize the information in the hexadecimal figures associated with the data points to identify the failures, outliers, trends, and other features in the data. The supplementary data analysis element 206 also suitably applies conventional correlation techniques to the data, for example to identify potentially redundant or related tests.

The computer 108 may perform additional analysis functions upon the generated statistics and the output test data, such as automatically identifying and classifying outliers (step 432). Analyzing each relevant datum according to the selected algorithm suitably identifies the outliers. If a particular algorithm is inappropriate for a set of data, the supplementary data analysis element 206 may be configured to automatically abort the analysis and select a different algorithm.

The supplementary data analysis element 206 may operate in any suitable manner to designate outliers, such as by comparison to selected values and/or according to treatment of the data in the data smoothing process. For example, an outlier identification element according to various aspects of the present invention initially automatically calibrates its sensitivity to outliers based on selected statistical relationships for each relevant datum (step 434). Some of these statistical relationships are then compared to a threshold or other reference point, such as the data mode, mean, or median, or combinations thereof, to define relative outlier threshold limits. In the present embodiment, the statistical relationships are scaled, for example by one, two, three, and six standard deviations of the data, to define the different outlier amplitudes (step 436). The output test data may then be compared to the outlier threshold limits to identify and classify the output test data as outliers (step 438).

The supplementary data analysis element 206 stores the resulting statistics and outliers in memory and identifiers, such as the x-y wafer map coordinates, associated with any such statistics and outliers (step 440). Selected statistics, outliers, and/or failures may also trigger notification events, such as sending an electronic message to an operator, triggering a light tower, stopping the tester 102, or notifying a server.

In the present embodiment, the supplementary data analysis element 206 includes a scaling element 210 and an outlier classification element 212. The scaling element 210 is configured to dynamically scale selected coefficients and other values according to the output test data. The outlier classification element 212 is configured to identify and/or classify the various outliers in the data according to selected algorithms.

More particularly, the scaling element of the present embodiment suitably uses various statistical relationships for dynamically scaling outlier sensitivity and smoothing coefficients for noise filtering sensitivity. The scaling coefficients are suitably calculated by the scaling element and used to modify selected outlier sensitivity values and smoothing coefficients. Any appropriate criteria, such as suitable statistical relationships, may be used for scaling. For example, a sample statistical relationship for outlier sensitivity scaling is defined as:

$$(\sqrt{1+\text{NaturalLog}_{Cpk}{}^2})$$

Another sample statistical relationship for outlier sensitivity and smoothing coefficient scaling is defined as:

$$(\sqrt{1+\text{NaturalLog}_{Cpk}{}^2})*Cpm$$

Another sample statistical relationship for outlier sensitivity and smoothing coefficient scaling is defined as:

$$\frac{(\sigma * Cpk)}{(\text{Max} - \text{Min})}, \text{ where } \sigma = \text{datum Standard Deviation}$$

A sample statistical relationship used in multiple algorithms for smoothing coefficient scaling is:

$$\frac{\sigma}{\mu} * 10, \text{ where } \sigma = \text{datum Standard Deviation and } \mu = \text{datum Mean}$$

Another sample statistical relationship used in multiple algorithms for smoothing coefficient scaling is:

$$\frac{\sigma^2}{\mu^2} * 10, \text{ where } \sigma = \text{datum Standard Deviation and } \mu = \text{datum Mean}$$

The outlier classification element is suitably configured to identify and/or classify components 106, output test data, and analysis results according to any suitable algorithm and the outliers in the output test data. The outlier classification element may also identify and classify selected outliers and components 106 according to the output test results and the information generated by the supplementary analysis element 206. For example, the outlier classification element is suitably configured to classify the components 106 into critical/marginal/good part categories, for example in conjunction with user-defined criteria; user-defined good/bad spatial patterns recognition; classification of pertinent data for tester data compression; test setup in-situ sensitivity qualifications and analyses; tester yield leveling analyses; dynamic wafer map and/or test strip mapping for part dispositions and dynamic retest; or test program optimization analyses. The outlier classification element may classify data in accordance with conventional SPC control rules, such as Western Electric rules or Nelson rules, to characterize the data.

The outlier classification element suitably classifies the data using a selected set of classification limit calculation methods. Any appropriate classification methods may be used to characterize the data according to the needs of the operator. The present outlier classification element, for example, classifies outliers by comparing the output test data to selected thresholds, such as values corresponding to one, two, three, and six statistically scaled standard deviations from a threshold, such as the data mean, mode, and/or median. The identification of outliers in this manner tends to normalize any identified outliers for any test regardless of datum amplitude and relative noise.

The outlier classification element analyzes and correlates the normalized outliers and/or the raw data points based on user-defined rules. Sample user-selectable methods for the purpose of part and pattern classification based on identified outliers are as follows:

Cumulative Amplitude, Cumulative Count Method:

$$Count_{LIMIT} = \mu_{OverallOutlierCount} + \left( \frac{3 * (\sigma^2_{OverallOutlierCount})}{(Max_{OverallOutlierCount} - Min_{OverallOutlierCount})} \right)$$

$$NormalizedOutlierAmplitude_{LIMIT} = \mu_{OverallNormalizedOutlierAmplitude} + \left( \frac{3 * (\sigma^2_{OverallNormalizedOutlierAmplitude})}{(Max_{OverallNormalizedOutlierAmplitude} - Min_{OverallNormalizedOutlierAmplitude})} \right)$$

Classification Rules:

$Part_{CRITICAL}$=True, If[$(Part_{Cumlative\ Outlier\ Count}$>$Count_{LIMIT}$)AND($Part_{Cumlative\ Normalized\ Outlier\ Amplitude}$>$NormalizedOutlier\ Amplitude_{LIMIT}$)]

$Part_{MARGINAL\ HighAmplitude}$=True, If[$(Part_{Cumlative\ Normalized\ Outlier\ Amplitude}$>$NormalizedOutlier\ Amplitude_{LIMIT}$)]

$Part_{MARGINAL\ HighCount}$=True, If($Part_{CumlativeOutlierCount}$>$Count_{LIMIT}$)

Cumulative Amplitude Squared, Cumulative Count Squared Method:

$$Count_{LIMIT^2} = \mu_{OverallOutlierCount}2 + \left( \frac{3 * (\sigma^2_{OverallOutherCount}2)}{(Max_{OverallOutlierCount}2 - Min_{OverallOutlierCount}2)} \right)$$

$$NormalizedOutlierAmplitude_{LIMIT^2} = \mu_{OverallNormalizedOutlierAmplitude}2 + \left( \frac{3 * (\sigma^2_{OverallNormalizedOutlierAmplitude}2)}{(Max_{OverallNormalizedOutlierAmplitude}2 - Min_{OverallNormalizedOutlierAmplitude}2)} \right)$$

Classification Rules:

$Part_{CRITICAL}$=True, If[$(Part_{CumlativeOutlierCount^2}$>$Count_{LIMIT^2}$)AND($Part_{CumlativeNormalizedOutlierAmplitude^2}$>$Normalized\ Outlier\ Amplitude_{LIMIT^2}$)]

$Part_{MARGINAL\ HighAmplitude}$=True, If[$(Part_{CumlativeNormalizedOutlierAmplitude^2}$>$Normalized\ Outlier\ Amplitude_{LIMIT^2}$)]

$Part_{MARGINAL\ HighCount}$=True, If[$(Part_{Cumlative\ Outlier\ Count^2}$>$Count_{LIMIT^2}$)]

N-Points Method:

The actual numbers and logic rules used in the following examples can be customized by the end user per scenario (test program, test node, tester, prober, handler, test setup, etc.). σ in these examples=σ relative to datum mean, mode, and/or median based on datum standard deviation scaled by key statistical relationships.

$Part_{CRITICAL}$=True, If[$((Part_{COUNT6\sigma}+Part_{COUNT3\sigma}) \geq 2)$OR$((Part_{COUNT2\sigma}+Part_{COUNT1\sigma}) \geq 6)$]

$Part_{CRITICAL}$=True, If[$((Part_{COUNT6\sigma}+Part_{COUNT3\sigma}) \geq 1)$AND$((Part_{COUNT2\sigma}+Part_{COUNT1\sigma}) \geq 3)$]

$Part_{MARGINAL}$=True, If[$((Part_{COUNT6\sigma}+Part_{COUNT3\sigma}+Part_{COUNT2\sigma}+Part_{COUNT1\sigma}) \geq 3)$]

$Part_{NOISY}$=True, If[$((Part_{COUNT6\sigma}+Part_{COUNT3\sigma}+Part_{COUNT2\sigma}+Part_{COUNT1\sigma}) \geq 1)$]

The supplementary data analysis element 206 may be configured to perform additional analysis of the output test data and the information generated by the supplementary data analysis element 206. For example, the supplementary data analysis element 206 may identify tests having high incidences of failure or outliers, such as by comparing the total or average number of failures, outliers, or outliers in a particular classification to one or more threshold values.

The supplementary data analysis element 206 may also be configured to correlate data from different tests to identify similar or dissimilar trends, for example by comparing cumulative counts, outliers, and/or correlating outliers between wafers or other data sets. The supplementary data analysis element 206 may also analyze and correlate data from different tests to identify and classify potential critical and/or marginal and/or good parts on the wafer. The supplementary data analysis element 206 may also analyze and correlate data from different tests to identify user-defined good part patterns and/or bad part patterns on a series of wafers for the purposes of dynamic test time reduction.

The supplementary data analysis element 206 is also suitably configured to analyze and correlate data from different tests to identify user-defined pertinent raw data for the purposes of dynamically compressing the test data into memory. The supplementary data analysis element may also analyze and correlate statistical anomalies and test data results for test node in-situ setup qualification and sensitivity analysis. Further, the supplementary data analysis element may contribute to test node yield leveling analysis, for example by identifying whether a particular test node may be improperly calibrated or otherwise producing inappropriate results. The supplementary data analysis element may moreover analyze and correlate the data for the purposes of test program optimization including, but not limited to, automatic identification of redundant tests using correlated results and outlier analysis and providing additional data for use in analysis. The supplementary data analysis element is also suitably configured to identify critical tests, for example by identifying regularly failed or almost failed tests, tests that are almost never-fail, and/or tests exhibiting a very low Cpk.

The supplementary data analysis may also provide identification of test sampling candidates, such as tests that are rarely or never failed or in which outliers are never detected. The supplementary data analysis element may also provide identification of the best order test sequence based on correlation techniques, such as conventional correlation techniques, combined with analysis and correlation of identified outliers and/or other statistical anomalies, number of failures, critical tests, longest/shortest tests, or basic functionality issues associated with failure of the test.

The supplementary data analysis may also provide identification of critical, marginal, and good parts as defined by sensitivity parameters in a recipe configuration file. Part identification may provide disposition/classification before packaging and/or shipping the part that may represent a reliability risk, and/or test time reduction through dynamic probe mapping of bad and good parts during wafer probe. Identification of these parts may be represented and output in any appropriate manner, for example as good and bad parts on a dynamically generated prober control map (for dynamic mapping), a wafer map used for offline inking equipment, a test strip map for strip testing at final test, a results file, and/or a database results table.

Supplemental data analysis at the cell controller level tends to increase quality control at the probe, and thus final test yields. In addition, quality issues may be identified at product run time, not later. Furthermore, the supplemental data analysis and signature analysis tends to improve the quality of data provided to the downstream and offline analysis tools, as well as test engineers or other personnel, by identifying outliers. For example, the computer 108 may include information on the wafer map identifying a group of components having signature analyses indicating a fault in the manufacturing process. Thus, the signature analysis system may identify potentially defective goods that went undetected using conventional test analysis.

EXAMPLE

Figure 10:
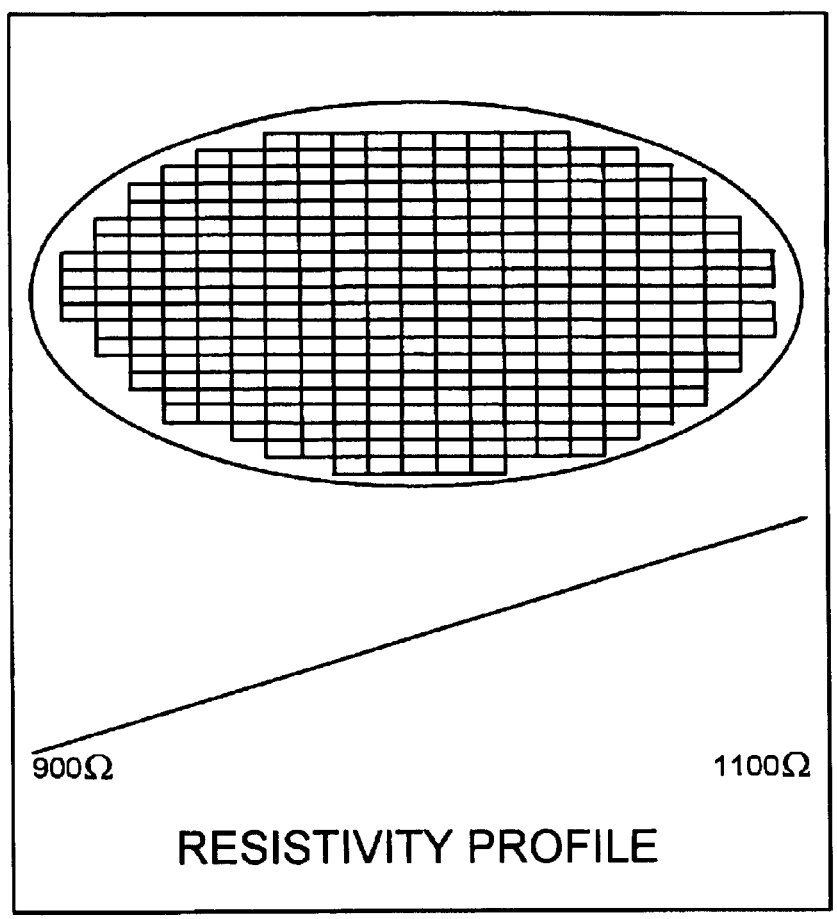
FIG. 10 is a representation of a wafer having multiple devices and a resistivity profile for the wafer.
Figure 11:
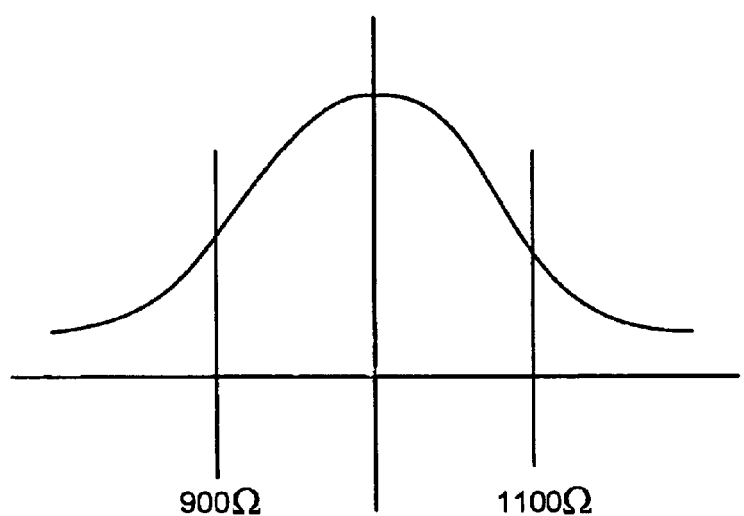
FIG. 11 is a graph of resistance values for a population of resistors in the various devices of the wafer of FIG. 10.

Referring now to FIG. 10, an array of semiconductor devices are positioned on a wafer. In this wafer, the general resistivity of resistor components in the semiconductor devices varies across the wafer, for example due to uneven deposition of material or treatment of the wafer. The resistance of any particular component, however, may be within the control limits of the test. For example, the target resistance of a particular resistor component may be 1000 Ω +/−10%. Near the ends of the wafer, the resistances of most of the resistors approach, but do not exceed, the normal distribution range of 900 Ω and 1100 Ω (FIG. 11).

Components on the wafer may include defects, for example due to a contaminant or imperfection in the fabrication process. The defect may increase the resistance of resistors located near the low-resistivity edge of the wafer to 1080 Ω. The resistance is well over the 1000 Ω expected for a device near the middle of the wafer, but is still well within the normal distribution range.

Figure 12A:
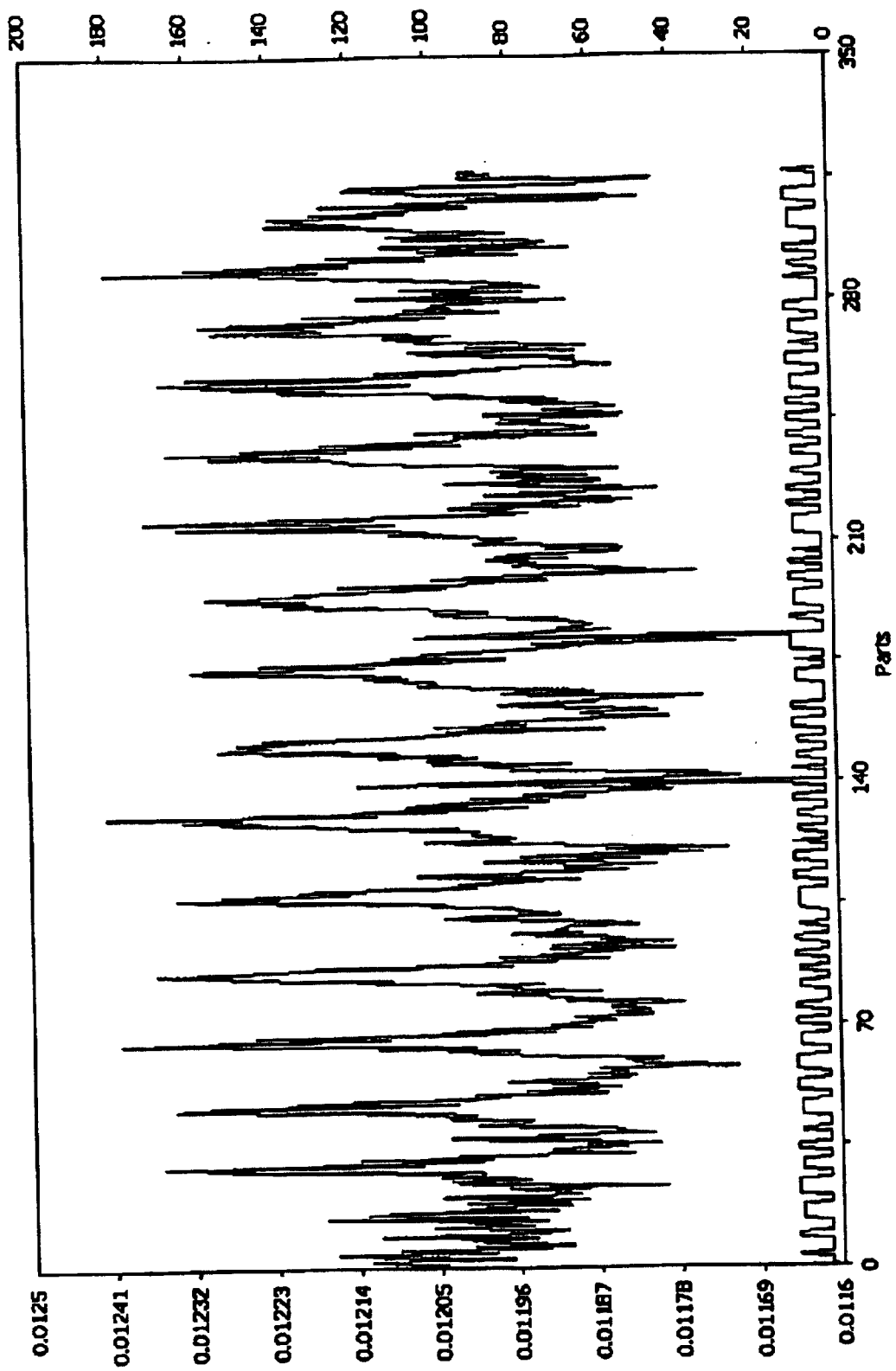
FIGS. 12A–B are general and detailed plots, respectively, of raw test data and smoothed test data for the various devices of FIG. 10.
Figure 12B:
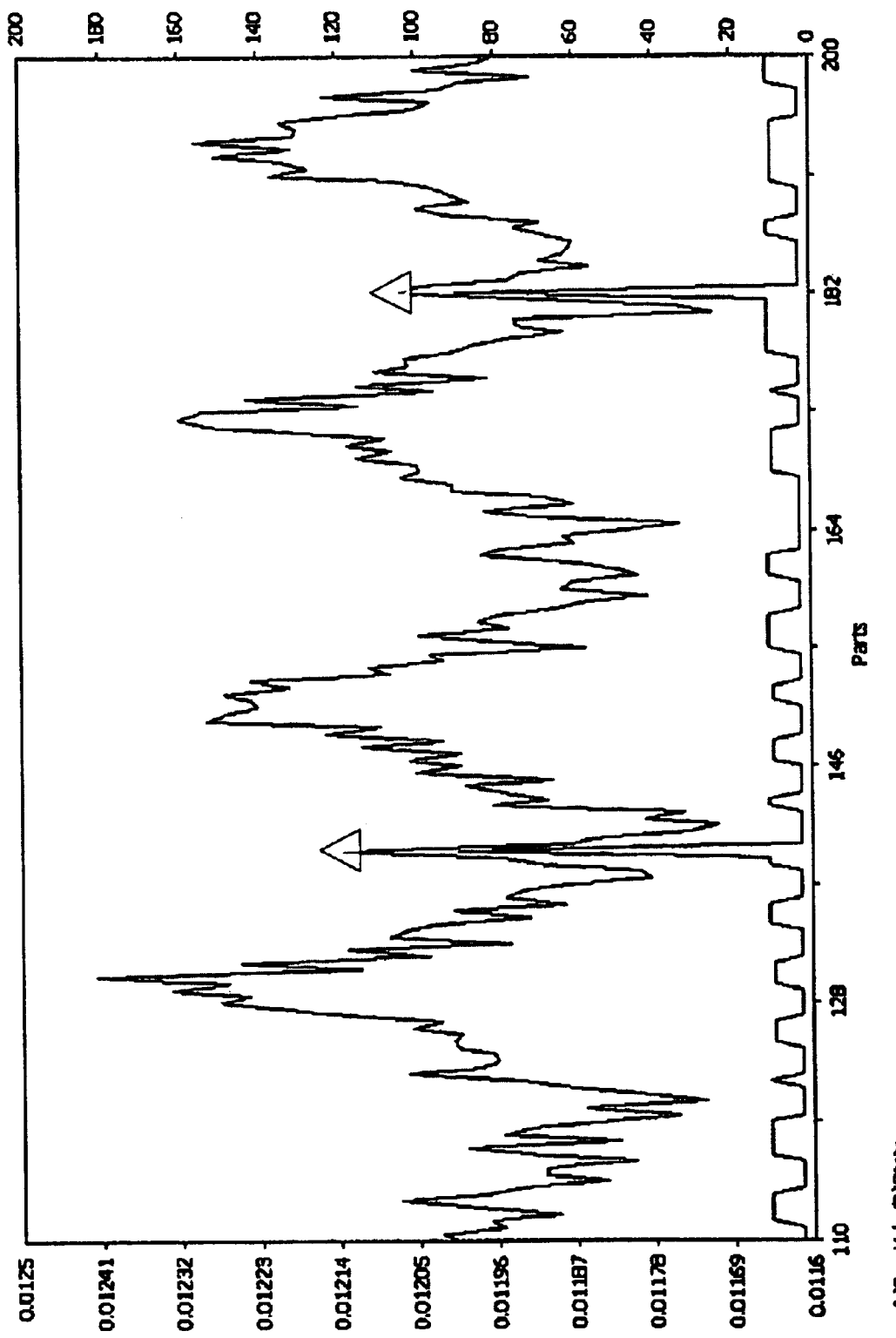

Referring to FIGS. 12A–B, the raw test data for each component may be plotted. The test data exhibit considerable variation, due in part to the varying resistivity among components on the wafer as the prober indexes across rows or columns of devices. The devices affected by the defect are not easily identifiable based on visual examination of the test data or comparison to the test limits.

When the test data is processed according to various aspects of the present invention, the devices affected by the defect may be associated with outliers in the test data. The smoothed test data is largely confined to a certain range of values. The data associated with the defects, however, is unlike the data for the surrounding components. Accordingly, the smoothed data illustrates the departure from the values associated with the surrounding devices without the defect. The outlier classification element may identify and classify the outliers according to the magnitude of the departure of the outlier data from the surrounding data.

The output element 208 collects data from the test system 100, suitably at run time, and provides an output report to a printer, database, operator interface, or other desired destination. Any form, such as graphical, numerical, textual, printed, or electronic form, may be used to present the output report for use or subsequent analysis. The output element 208 may provide any selected content, including selected output test data from the tester 102 and results of the supplementary data analysis.

Figure 7:
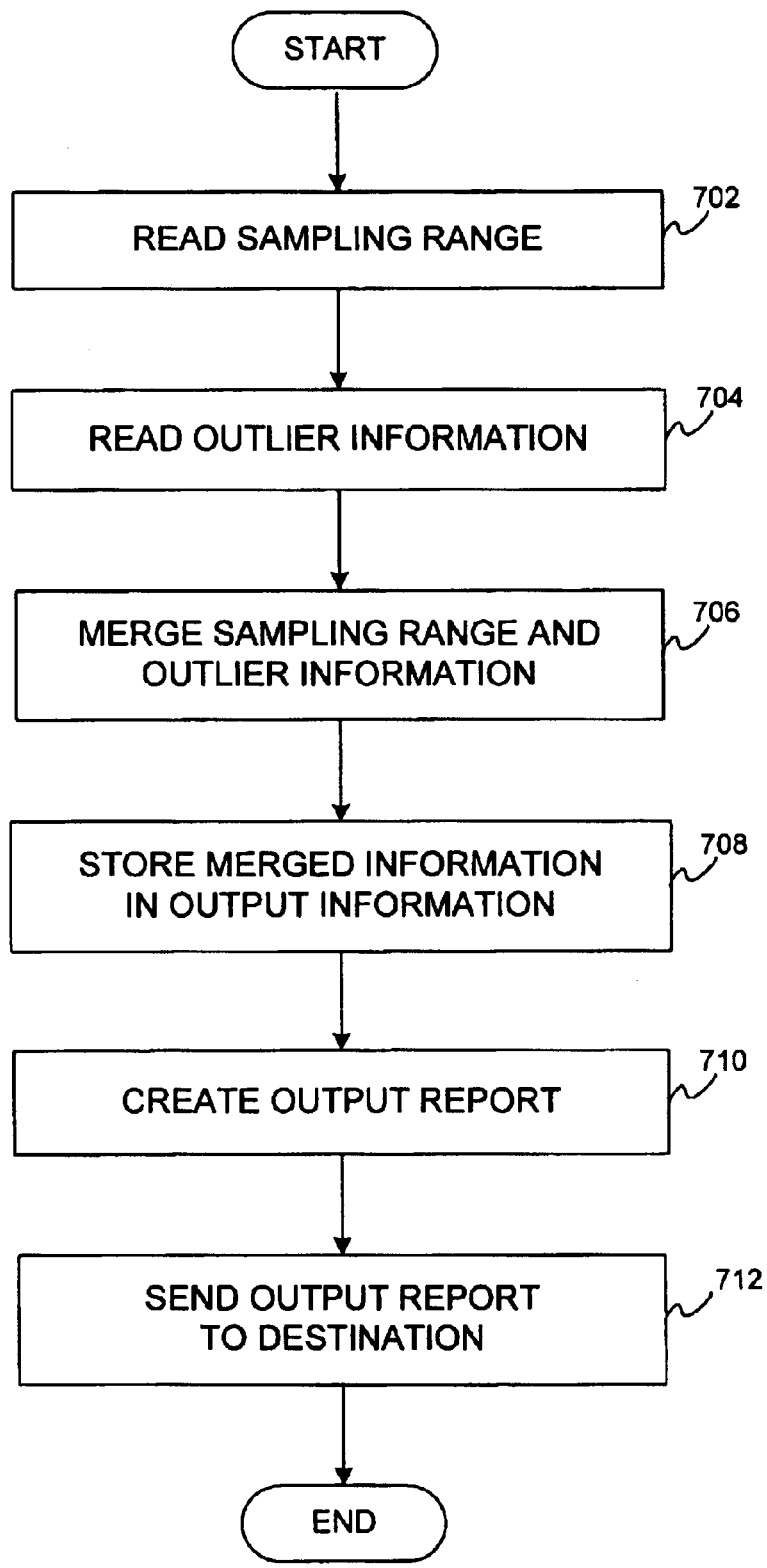
FIG. 7 illustrates a flow chart for an output element.

In the present embodiment, the output element 208 suitably provides a selection of data from the output test data specified by the operator as well as supplemental data at product run time via the dynamic datalog. Referring to FIG. 7, the output element 208 initially reads a sampling range from the database 114 (step 702). The sampling range identifies predetermined information to be included in the output report. In the present embodiment, the sampling range identifies components 106 on the wafer selected by the operator for review. The predetermined components may be selected according to any criteria, such as data for various circumferential zones, radial zones, random components, or individual stepper fields. The sampling range comprises a set of x-y coordinates corresponding to the positions of the predetermined components on the wafer or an identified portion of the available components in a batch.

The output element 208 may also be configured to include information relating to the outliers, or other information generated or identified by the supplementary data analysis element, in the dynamic datalog (step 704). If so configured, the identifiers, such as x-y coordinates, for each of the outliers are assembled as well. The coordinates for the operator-selected components and the outliers are merged into the dynamic datalog (step 706). The output element 208 retrieves selected information, such as the raw test data and one or more data from the supplementary data analysis element 206, for each entry in the merged x-y coordinate array of the dynamic datalog (step 708).

The retrieved information is then suitably stored in an appropriate output report (step 710). The report may be prepared in any appropriate format or manner. In the present embodiment, the output report suitably includes the dynamic datalog having a wafer map indicating the selected components on the wafer and their classification. Further, the output element 208 may superimpose wafer map data corresponding to outliers on the wafer map of the preselected components. Additionally, the output element may include only the outliers from the wafer map or batch as the sampled output. The output report may also include a series of graphical representations of the data to highlight the occurrence of outliers and correlations in the data. The output report may further include recommendations and supporting data for the recommendations. For example, if two tests appear to generate identical sets of failures and/or outliers, the output report may include a suggestion that the tests are redundant and recommend that one of the tests be omitted from the test program. The recommendation may include a graphical representation of the data showing the identical results of the tests.

The output report may be provided in any suitable manner, for example output to a local workstation, sent to a server, activation of an alarm, or any other appropriate manner (step 712). In one embodiment, the output report may be provided off-line such that the output does not affect the operation of the system or transfer to the main server. In this configuration, the computer 108 copies data files, performs the analysis, and generates results, for example for demonstration or verification purposes.

The particular implementations shown and described herein are illustrative of the invention and its best mode and are not intended to otherwise limit the scope of the present invention in any way. Indeed, for the sake of brevity, conventional signal processing, data transmission, and other functional aspects of the systems (and components of the individual operating components of the systems) may not be described in detail herein. Furthermore, the connecting lines shown in the various figures contained herein are intended to represent exemplary functional relationships and/or physical couplings between the various elements. Many alternative or additional functional relationships or physical connections may be present in a practical test system. The present invention has been described above with reference to a preferred embodiment. However, changes and modifications may be made to the preferred embodiment without departing from the scope of the present invention.

The present invention has been described with reference to a preferred embodiment. Changes and modifications may be made, however, without departing from the scope of the present invention. These and other changes or modifications are intended to be included within the scope of the present invention, as expressed in the following claims.

What is claimed is:

1. A test system, comprising:
   a tester configured to test a component and generate test data; and
   a computer connected to the tester and configured to receive the test data, identify an outlier in the test data, and generate an output report including the identified outlier.

2. A test system according to claim 1, wherein the computer is configured to operate in conjunction with a set of configuration data in a recipe file.

3. A test system according to claim 1, wherein the test data corresponds to a section group of components on a wafer.

4. A test system according to claim 1, wherein the computer is configured to automatically calibrate a sensitivity of the computer to the test data.

5. A test system according to claim 1, wherein the computer further comprises a data correlation element configured to correlate the test data.

6. A test system according to claim 1, wherein the computer is configured to identify the outlier at run time.

7. A test system according to claim 1, wherein the computer further comprises a data smoothing element configured to receive the test data and smooth the test data, and wherein the computer is configured to receive the smoothed test data and identify the outlier in the smoothed test data.

8. A data analysis system for semiconductor test data, comprising a computer system, wherein the computer system is configured to operate:

a supplementary data analysis element configured to identify outliers in the semiconductor test data; and
   an output element configured to generate an output report including the identified outliers.

9. A data analysis system according to claim 8, wherein the supplementary data analysis element is configured to operate in conjunction with a set of configuration data in a recipe file.

10. A data analysis system according to claim 8, wherein the test data corresponds to a section group of components on a wafer.

11. A data analysis system according to claim 8, wherein the supplementary data analysis element is configured to automatically calibrate a sensitivity of the outlier identification element to the test data.

12. A data analysis system according to claim 8, wherein the supplementary data analysis element includes a data correlation element configured to correlate the test data.

13. A data analysis system according to claim 8, wherein the supplementary data analysis element is configured to identify the outliers at run time.

14. A data analysis system according to claim 8, wherein the supplementary data analysis element includes a data smoothing element configured to receive the test data and smooth the test data, and wherein the supplementary data analysis element is configured to identify the outliers in the smoothed test data.

15. A method for testing semiconductors, comprising:
    generating test data for multiple components; and
    automatically identifying an outlier in the test data at run time using a computer system.

16. A method according to claim 15, further comprising reading configuration data from a recipe file using the computer system, wherein identifying the outlier includes identifying the outlier according to the configuration data in the recipe file.

17. A method according to claim 15, wherein the test data corresponds to a section group of components on a wafer.

18. A method according to claim 15, further comprising calibrating a sensitivity for identifying the outlier in the test data using the computer system.

19. A method according to claim 15, further comprising smoothing the test data using the computer system.

20. A method according to claim 15, further comprising correlating the test data to identify similarities in the test data using the computer system.

* * * * *

(12) EX PARTE REEXAMINATION CERTIFICATE (7936th)
United States Patent
Tabor

(10) Number: US 6,792,373 C1
(45) Certificate Issued: Dec. 14, 2010

(54) METHOD AND APPARATUS FOR SEMICONDUCTOR TESTING

(75) Inventor: Eric Paul Tabor, Gilbert, AZ (US)

(73) Assignee: Test Advantage, Inc., Tempe, AZ (US)

Reexamination Request:
No. 90/008,313, Nov. 2, 2006

Reexamination Certificate for:
Patent No.: 6,792,373
Issued: Sep. 14, 2004
Appl. No.: 10/154,627
Filed: May 24, 2002

Related U.S. Application Data

(63) Continuation-in-part of application No. 09/872,195, filed on May 31, 2001, now Pat. No. 6,782,297.
(60) Provisional application No. 60/293,577, filed on May 24, 2001, provisional application No. 60/295,188, filed on May 31, 2001, and provisional application No. 60/374,328, filed on Apr. 21, 2002.

(51) Int. Cl.
*G01D 3/00* (2006.01)
*G01M 19/00* (2006.01)
*G01P 21/00* (2006.01)

(52) U.S. Cl. .................. 702/108; 702/117; 702/118; 702/119; 702/120

(58) Field of Classification Search ............... None
See application file for complete search history.

(56) References Cited

U.S. PATENT DOCUMENTS 5,835,891 A 11/1998 Stoneking
6,184,048 B1 * 2/2001 Ramon .................. 438/14
6,574,760 B1 * 6/2003 Mydill .................. 714/724

OTHER PUBLICATIONS

Bauer, Marcus et al, The identification of Multiple Outliers in Online Monitoring Data; Journal; Technical Report 29, SFB 475, University of Dortmund, 1999, 29 Pages; Germany.

Motorola, Inc., Process Average Testing (PAT) Statistical Yield Analysis (SYA) and Junction Verification Test (JVT); Specification; Aug. 3, 1998, Motorola Publication; 9 Pages USA.

Gneiting, Thomas et al; Measurement Related and Model Parameter Related Statistics; Book; Oct. 11, 2000; 33 Pages; USA.

Romanchik, Daniel; PAT Improves Auto IC Reliability; Online Publication; Aug. 2000; 2 Pages; USA.

Daasch, Robert et al; Variance Reduction Using Wafer Patterns in Iddq Data; Symposium; itc, p. 189, Proceedings International Test Conference 2000, 2000 USA.

Michelson, Diane K.; Statistically Calculating Reject Limits at Parametric Test; Symposium; Electronics Manufacturing Technology Symposium, Oct. 1997: 5 Pages; USA.

Nigh, Phil et al; Test Method Evaluation Experiments & Data; Symposium; Proceedings of the 2000 IEEE International Test Conference; 2000; 10 Pages; USA.

Lingzhou, Canfield; IC–CAP 5.0 Statistics Package Overview; Symposium; Mar. 1997; 11 pages; USA.

Bilosi, Peter; Developing a Defect Reduction Strategy for the Copper Dual–Damascene Oxide Etch Process; Online Magazine; Jul. 2000; 9 pages; USA.

* cited by examiner

*Primary Examiner*—Mary Steelman

(57) ABSTRACT

A method and apparatus for testing semiconductors according to various aspects of the present invention comprises a test system comprising an outlier identification element configured to identify significant data in a set of test results. The test system may be configured to provide the data in an output report. The outlier identification element suitably performs the analysis at run time. The outlier identification element may also operate in conjunction with a smoothing system to smooth the data and identify trends and departures from test result norms.

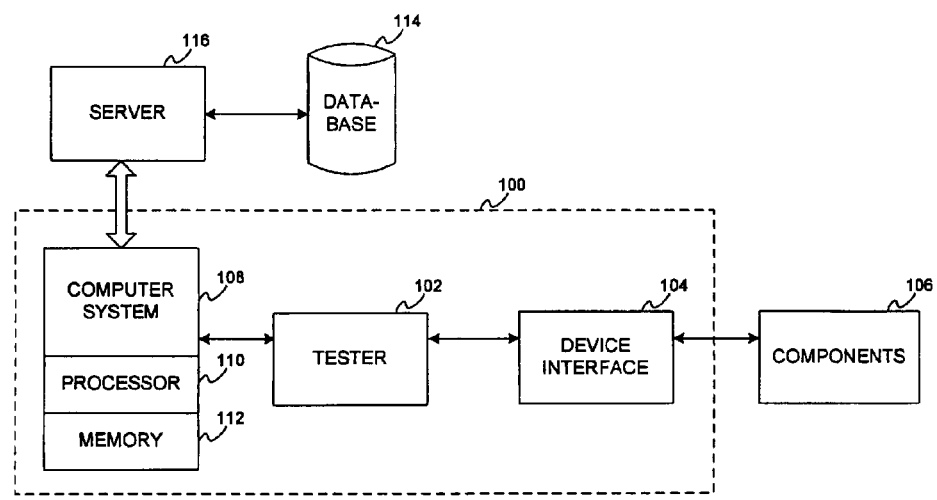

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-20 is confirmed.

* * * * *